US00RE48563E

(19) United States
(12) Reissued Patent
Kim et al.

(10) Patent Number: US RE48,563 E
(45) Date of Reissued Patent: May 18, 2021

(54) METHOD FOR TRANSMITTING DATA BY USING POLAR CODING IN WIRELESS ACCESS SYSTEM

(71) Applicant: LG Electronics Inc., Seoul (KR)

(72) Inventors: Bonghoe Kim, Seoul (KR); Dongyoun Seo, Seoul (KR)

(73) Assignee: LG Electronics Inc., Seoul (KR)

(21) Appl. No.: 16/575,017

(22) Filed: Sep. 18, 2019

Related U.S. Patent Documents

Reissue of:
(64) Patent No.: 9,768,915
Issued: Sep. 19, 2017
Appl. No.: 14/909,901
PCT Filed: Aug. 20, 2014
PCT No.: PCT/KR2014/007716
§ 371 (c)(1),
(2) Date: Feb. 3, 2016
PCT Pub. No.: WO2015/026148
PCT Pub. Date: Feb. 26, 2015

U.S. Applications:
(60) Provisional application No. 61/867,606, filed on Aug. 20, 2013, provisional application No. 61/941,456, filed on Feb. 18, 2014.

(51) Int. Cl.
*H04L 1/00* (2006.01)
*H03M 13/00* (2006.01)
(Continued)

(52) U.S. Cl.
CPC ..... *H04L 1/00* (2013.01); *H03M 13/09* (2013.01); *H03M 13/13* (2013.01);
(Continued)

(58) Field of Classification Search
CPC ..... H04L 1/00; H04L 1/0041; H04L 1/0061; H04L 1/0068; H04L 1/1671;
(Continued)

(56) References Cited

U.S. PATENT DOCUMENTS 8,064,333 B2 * 11/2011 Yue ..... H04L 1/0003 370/216
2013/0117344 A1 5/2013 Gross et al.
(Continued)

OTHER PUBLICATIONS

Erdal Arikan; "Channel Polarization: A Method for Constructing Capacity-Achieving Codes for Symmetric Binary-Input Memoryless Channels"; Jul. 2009; IEEE Transactions on Information Theory; vol. 55, No. 7; pp. 3051-3073.*
(Continued)

*Primary Examiner* — William H. Wood
(74) *Attorney, Agent, or Firm* — Dentons US LLP

(57) ABSTRACT

The present invention relates to data transmission/reception methods using a polar coding scheme, and devices for supporting same. The method for transmitting data by using polar coding in a wireless access system, according to one embodiment of the present invention, may comprise the steps of deriving Bhattacharyya parameters according to data bits input for finding noise-free channels among equivalent channels; allocating data payloads comprising data bits and cyclic redundancy check (CRC) bits to the found noise-free channels; inputting the data payloads into a polar encoder; and transmitting code bits output by the polar encoder, wherein the CRC bits may be allocated to better noise-free channels, among the noise-free channels indicated by the Bhattacharyya parameters, than the data bits.

18 Claims, 18 Drawing Sheets

(51) Int. Cl.

| | |
|---|---|
| ***H03M 13/09*** | (2006.01) |
| ***H03M 13/13*** | (2006.01) |
| ***H03M 13/29*** | (2006.01) |
| ***H03M 13/35*** | (2006.01) |
| ***H04L 1/18*** | (2006.01) |
| ***H04L 1/16*** | (2006.01) |

(52) U.S. Cl.
CPC ..... *H03M 13/2906* (2013.01); *H03M 13/353* (2013.01); *H03M 13/356* (2013.01); *H03M 13/6356* (2013.01); *H03M 13/6362* (2013.01); *H03M 13/6525* (2013.01); *H04L 1/0041* (2013.01); *H04L 1/0061* (2013.01); *H04L 1/0068* (2013.01); *H04L 1/1671* (2013.01); *H04L 1/1861* (2013.01)

(58) Field of Classification Search
CPC ..... H04L 1/1861; H03M 13/09; H03M 13/13; H03M 13/353; H03M 13/356; H03M 13/2906; H03M 13/6362; H03M 13/6356; H03M 13/6525
See application file for complete search history.

(56) References Cited

U.S. PATENT DOCUMENTS

2015/0026543 A1* 1/2015 Li ..... H03M 13/13 714/776
2015/0194987 A1* 7/2015 Li ..... H04L 1/0057 714/752

OTHER PUBLICATIONS

Erdal Arikan; "Channel Polarization: A Method for Constructing Capacity-Achieving Codes"; Jul. 6-11, 2008; ISIT 2008, Toronto, Canada; pp. 1173-1177.*
Chen et al.; "Improved Successive Cancellation Decoding of Polar Codes"; Jan. 17, 2013; arXiv:1208.3598v2; pp. 1-9.*
Bonik et al.; "A variant of list plus CRC concatenated polar code"; Jul. 19, 2012; arXiv:1207.4661v1; 4 pages.*
Tal et al.; "List Decoding of Polar Codes"; May 31, 2012; arXiv:1206.0050v1; pp. 1-11.*
Tal et al.; "How to Construct Polar Codes"; Apr. 10, 2013; arXiv:1105.6164v3; pp. 1-21.*
Kai Niu et al.: "Beyond Turbo Codes: Rate-Compatible Punctured Polar Codes", 2013 IEEE International Conference on Communication (ICC) Budapest Hungary, Jun. 9-13, 2013, see pp. 3423-3427; and figure 1.
Peyman Hesami, "Channel Polarization and Polar Codes: Capacity Achieving", Tutorial of Information Theory Course, University of Notre Dame, Dec. 9, 2009, see pp. 1-9.
Kai Niu et al.: "CRC-Aided Decoding of Polar Codes", IEEE Communications Letters, vol. 16, No. 10, Oct. 2012, see pp. 1668-1671.
Bin Li et al., "An Adaptive Successive Cancellation List Decoder for Polar Codes with Cyclic Redundancy Check", IEEE Communications Letters, vol. 16, issue Dec. 12, 2012, see pp. 1-4.
Written Opinion of the ISA from PCT/KR2014/007716, dated Nov. 28, 2014.

* cited by examiner

PUCCH format 2, 2a and 2b structure (normal CP case)

PUCCH format 2, 2a and 2b structure (extended CP case)

PUCCH format 1a and 1b structure (normal CP case)

PUCCH format 1a and 1b structure (extended CP case)

METHOD FOR TRANSMITTING DATA BY USING POLAR CODING IN WIRELESS ACCESS SYSTEM

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application is *a reissue of U.S. Pat. No. 9,768,915, which issued Sep. 19, 2017 from U.S. patent application Ser. No. 14/909,901, filed Feb. 3, 2016, which is* a 35 USC §371 National Stage entry of International Application No. PCT/KR2014/007716 filed on Aug. 20, 2014, and claims priority to U.S. Provisional Application Nos. 61/867,606 filed on Aug. 20, 2013 and 61/941,456 filed on Feb. 18, 2014, all of which are hereby incorporated by reference in their entireties as if fully set forth herein.

TECHNICAL FIELD

The present invention relates to a wireless access system, and more particularly, to a method for applying a polar coding scheme to a wireless access system and a device for supporting the same. That is, the present invention relates to a method for transmitting and receiving data using a polar coding scheme and a device for supporting the same.

BACKGROUND ART

Wireless access systems have been widely deployed to provide various types of communication services such as voice or data. In general, a wireless access system is a multiple access system that supports communication of multiple users by sharing available system resources (a bandwidth, transmission power, etc.) among them. For example, multiple access systems include a Code Division Multiple Access (CDMA) system, a Frequency Division Multiple Access (FDMA) system, a Time Division Multiple Access (TDMA) system, an Orthogonal Frequency Division Multiple Access (OFDMA) system, and a Single Carrier Frequency Division Multiple Access (SC-FDMA) system.

DISCLOSURE

Technical Problem

An object of the present invention is to provide methods for efficiently transmitting and receiving data.

Another object of the present invention is to provide methods for coding input data bits using a polar coding scheme for efficient data transmission and reception.

Still another object of the present invention is to provide rate matching methods for coding bits coded using a polar coding scheme.

Further still another object of the present invention is to provide various methods for configuring generator matrixes of a polar encoder for applying a polar coding scheme.

Further still another object of the present invention is to provide methods for applying HARQ when a polar coding scheme is applied.

Further still another object of the present invention is to provide devices for supporting the aforementioned methods.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

Technical Solution

The present invention relates to a method for applying a polar coding scheme to a wireless access system and a device for supporting the same. That is, the present invention discloses a method for transmitting and receiving data using a polar coding scheme and devices for supporting the same.

In one aspect of the present invention, a method for transmitting data by using polar coding in a wireless access system comprises the steps of deriving Bhattacharyya parameters in accordance with data bits input to discover noise free channels from equivalent channels; allocating a data payload including data bits and cyclic redundancy check (CRC) bits to the discovered noise free channels; inputting the data payload to a polar encoder; and transmitting code bits output from the polar encoder. At this time, the CRC bits can be allocated to a noise free channel better than the data bits, among the noise free channels indicated by the Bhattacharyya parameters.

The method may further comprise the step of performing rate matching for the data payload considering a size of the data payload and a size of a code block of the polar encoder.

At this time, the method may further comprise the step of generating a generator matrix used for the polar encoder by puncturing a specific column of a mother generator matrix as much as a size difference if the size of the code block of the polar encoder is greater than the size of the data payload in the step of performing rate matching.

In this case, the specific column may be selected as much as the size difference from the column having the lowest weight value, and the weight value may be set to the number of '1' among elements of the mother generator matrix.

Otherwise, the specific column may be selected considering a minimum distance set based on an index of a noise free channel to which the data bits are allocated.

Otherwise, the specific column may be selected considering a priority according to a column index.

The method may further comprise the step of generating a generator matrix used for the polar encoder by repeating a specific column of a mother generator matrix as much as a size difference if the size of the code block of the polar encoder is smaller than the size of the data payload in the step of performing rate matching.

At this time, the specific column may be selected as much as the size difference from the column having the highest weight value, and the weight value may be set to the number of '1' among elements of the mother generator matrix.

The method may further comprise the step of transmitting size information indicating the size of the data payload and information on a coding rate of a code block of the polar encoder to a receiver.

It is to be understood that both the foregoing general description and the foll owing detailed description of the present invention are exemplary and explanatory and are i ntended to provide further explanation of the invention as claimed

Advantageous Effects

As is apparent from the above description, the embodiments of the present invention have the following effects.

First of all, a polar coding scheme is applied to a wireless access system, whereby data can be transmitted and received efficiently.

Secondly, if a polar coding scheme is used, a generator matrix is configured considering a weight value, a minimum distance and/or a priority, whereby data matching can be performed in accordance with the number of bits of a data payload.

Thirdly, new methods for performing HARQ are suggested during application of a polar coding scheme.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

BRIEF DESCRIPTION OF THE DRAWINGS

The accompanying drawings, which are included to provide a further understanding of the invention, illustrate embodiments of the invention and together with the description serve to explain the principle of the invention.

BEST MODE FOR CARRYING OUT THE INVENTION

Figure 1:
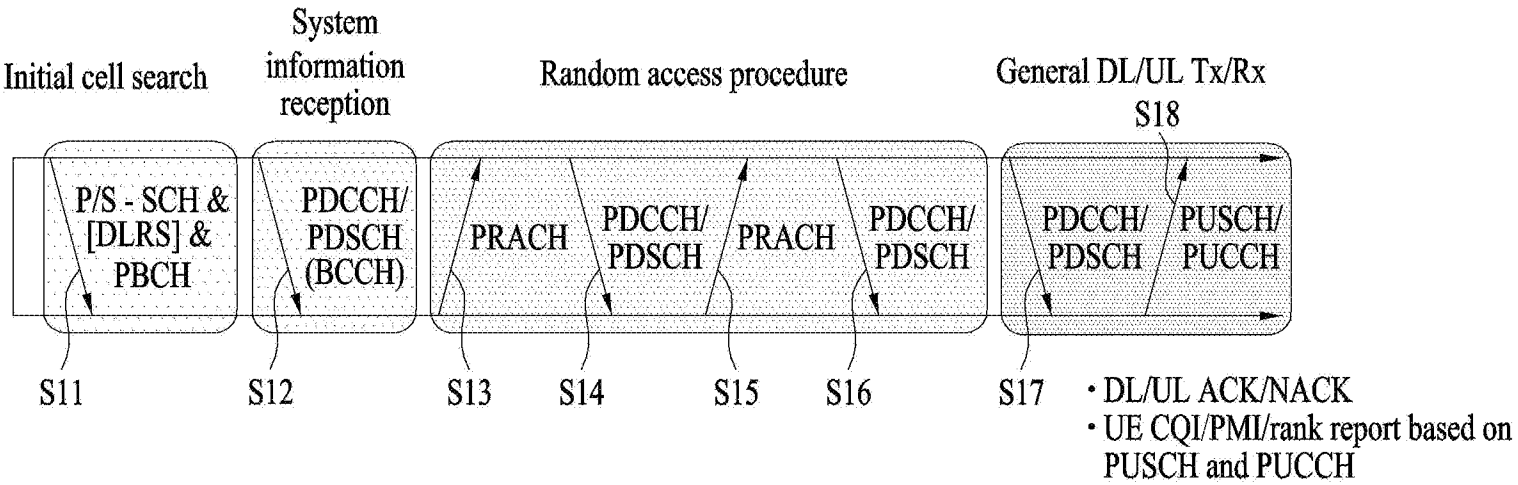
FIG. 1 is a conceptual diagram illustrating physical channels used in the embodiments and a signal transmission method using the physical channels.

The embodiments of the present invention described in detail hereinafter provides methods for transmitting CSI in a wireless access system that supports a multi-connection mode in which a user equipment is connected with two or more small cells and devices for supporting the same.

The embodiments of the present disclosure described below are combinations of elements and features of the present disclosure in specific forms. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions or elements of any one embodiment may be included in another embodiment and may be replaced with corresponding constructions or features of another embodiment.

In the description of the attached drawings, a detailed description of known procedures or steps of the present disclosure will be avoided lest it should obscure the subject matter of the present disclosure. In addition, procedures or steps that could be understood to those skilled in the art will not be described either.

Throughout the specification, when a certain portion "includes" or "comprises" a certain component, this indicates that other components are not excluded and may be further included unless otherwise noted. The terms "unit", "-or/er" and "module" described in the specification indicate a unit for processing at least one function or operation, which may be implemented by hardware, software or a combination thereof. In addition, the terms "a or an", "one", "the" etc. may include a singular representation and a plural representation in the context of the present invention (more particularly, in the context of the following claims) unless indicated otherwise in the specification or unless context clearly indicates otherwise.

In the embodiments of the present disclosure, a description is mainly made of a data transmission and reception relationship between a Base Station (BS) and a User Equipment (UE). A BS refers to a terminal node of a network, which directly communicates with a UE. A specific operation described as being performed by the BS may be performed by an upper node of the BS.

Namely, it is apparent that, in a network comprised of a plurality of network nodes including a BS, various operations performed for communication with a UE may be performed by the BS, or network nodes other than the BS. The term 'BS' may be replaced with a fixed station, a Node B, an evolved Node B (eNode B or eNB), an Advanced Base Station (ABS), an access point, etc.

In the embodiments of the present disclosure, the term terminal may be replaced with a UE, a Mobile Station (MS), a Subscriber Station (SS), a Mobile Subscriber Station (MSS), a mobile terminal, an Advanced Mobile Station (AMS), etc.

A transmitter is a fixed and/or mobile node that provides a data service or a voice service and a receiver is a fixed and/or mobile node that receives a data service or a voice service. Therefore, a UE may serve as a transmitter and a BS may serve as a receiver, on an UpLink (UL). Likewise, the UE may serve as a receiver and the BS may serve as a transmitter, on a DownLink (DL).

The embodiments of the present disclosure may be supported by standard specifications disclosed for at least one of wireless access systems including an Institute of Electrical and Electronics Engineers (IEEE) 802.xx system, a 3rd Generation Partnership Project (3GPP) system, a 3GPP Long Term Evolution (LTE) system, and a 3GPP2 system. In particular, the embodiments of the present disclosure may be supported by the standard specifications, 3GPP TS 36.211, 3GPP TS 36.212, 3GPP TS 36.213, 3GPP TS 36.321 and 3GPP TS 36.331. That is, the steps or parts, which are not described to clearly reveal the technical idea of the present disclosure, in the embodiments of the present disclosure may be explained by the above standard specifications. All terms used in the embodiments of the present disclosure may be explained by the standard specifications.

Reference will now be made in detail to the embodiments of the present disclosure with reference to the accompanying drawings. The detailed description, which will be given below with reference to the accompanying drawings, is intended to explain exemplary embodiments of the present disclosure, rather than to show the only embodiments that can be implemented according to the invention.

The following detailed description includes specific terms in order to provide a thorough understanding of the present disclosure. However, it will be apparent to those skilled in the art that the specific terms may be replaced with other terms without departing the technical spirit and scope of the present disclosure.

Hereinafter, 3GPP LTE/LTE-A systems which are examples of a wireless access system which can be applied to embodiments to the present invention will be explained.

The embodiments of the present disclosure can be applied to various wireless access systems such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), etc.

CDMA may be implemented as a radio technology such as Universal Terrestrial Radio Access (UTRA) or CDMA2000. TDMA may be implemented as a radio technology such as Global System for Mobile communications (GSM)/General packet Radio Service (GPRS)/Enhanced Data Rates for GSM Evolution (EDGE). OFDMA may be implemented as a radio technology such as IEEE 802.11 (Wi-Fi), IEEE 802.16 (WiMAX), IEEE 802.20, Evolved UTRA (E-UTRA), etc.

UTRA is a part of Universal Mobile Telecommunications System (UMTS). 3GPP LTE is a part of Evolved UMTS (E-UMTS) using E-UTRA, adopting OFDMA for DL and SC-FDMA for UL. LTE-Advanced (LTE-A) is an evolution of 3GPP LTE. While the embodiments of the present disclosure are described in the context of a 3GPP LTE/LTE-A system in order to clarify the technical features of the present disclosure, the present disclosure is also applicable to an IEEE 802.16e/m system, etc.

1. 3GPP LTE/LTE-A System

In a wireless access system, a UE receives information from an eNB on a DL and transmits information to the eNB on a UL. The information transmitted and received between the UE and the eNB includes general data information and various types of control information. There are many physical channels according to the types/usages of information transmitted and received between the eNB and the UE.

1.1 System Overview

FIG. 1 illustrates physical channels and a general method using the physical channels, which may be used in embodiments of the present disclosure.

When a UE is powered on or enters a new cell, the UE performs initial cell search (S11). The initial cell search involves acquisition of synchronization to an eNB. Specifically, the UE synchronizes its timing to the eNB and acquires information such as a cell Identifier (ID) by receiving a Primary Synchronization Channel (P-SCH) and a Secondary Synchronization Channel (S-SCH) from the eNB.

Then the UE may acquire information broadcast in the cell by receiving a Physical Broadcast Channel (PBCH) from the eNB.

During the initial cell search, the UE may monitor a DL channel state by receiving a Downlink Reference Signal (DL RS).

After the initial cell search, the UE may acquire more detailed system information by receiving a Physical Downlink Control Channel (PDCCH) and receiving a Physical Downlink Shared Channel (PDSCH) based on information of the PDCCH (S12).

To complete connection to the eNB, the UE may perform a random access procedure with the eNB (S13 to S16). In the random access procedure, the UE may transmit a preamble on a Physical Random Access Channel (PRACH) (S13) and may receive a PDCCH and a PDSCH associated with the PDCCH (S14). In the case of contention-based random access, the UE may additionally perform a contention resolution procedure including transmission of an additional PRACH (S15) and reception of a PDCCH signal and a PDSCH signal corresponding to the PDCCH signal (S16).

After the above procedure, the UE may receive a PDCCH and/or a PDSCH from the eNB (S17) and transmit a Physical Uplink Shared Channel (PUSCH) and/or a Physical Uplink Control Channel (PUCCH) to the eNB (S18), in a general UL/DL signal transmission procedure.

Control information that the UE transmits to the eNB is generically called Uplink Control Information (UCI). The UCI includes a Hybrid Automatic Repeat and reQuest Acknowledgement/Negative Acknowledgement (HARQ-ACK/NACK), a Scheduling Request (SR), a Channel Quality Indicator (CQI), a Precoding Matrix Index (PMI), a Rank Indicator (RI), etc.

In the LTE system, UCI is generally transmitted on a PUCCH periodically. However, if control information and traffic data should be transmitted simultaneously, the control information and traffic data may be transmitted on a PUSCH. In addition, the UCI may be transmitted aperiodically on the PUSCH, upon receipt of a request/command from a network.

Figure 2:
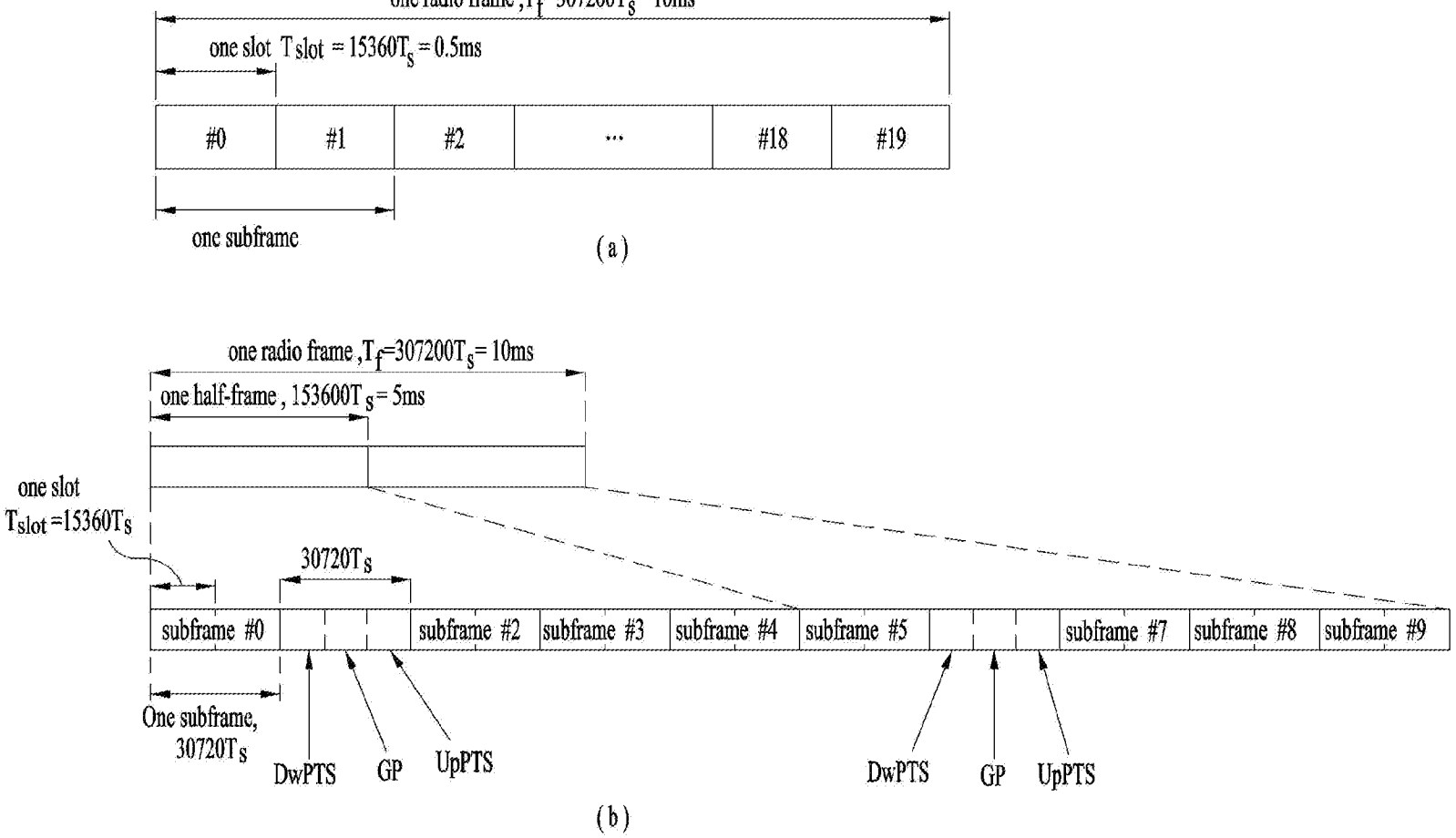
FIG. 2 is a diagram illustrating a structure of a radio frame for use in the embodiments.

FIG. 2 illustrates exemplary radio frame structures used in embodiments of the present disclosure.

FIG. 2(a) illustrates frame structure type 1. Frame structure type 1 is applicable to both a full Frequency Division Duplex (FDD) system and a half FDD system.

One radio frame is 10 ms (Tf=307200·Ts) long, including equal-sized 20 slots indexed from 0 to 19. Each slot is 0.5 ms (Tslot=15360·Ts) long. One subframe includes two successive slots. An ith subframe includes 2ith and (2i+1)th slots. That is, a radio frame includes 10 subframes. A time required for transmitting one subframe is defined as a Transmission Time Interval (TTI). Ts is a sampling time given as Ts=1/(15 kHzx2048)=3.2552×10-8 (about 33 ns). One slot includes a plurality of Orthogonal Frequency Division Multiplexing (OFDM) symbols or SC-FDMA symbols in the time domain by a plurality of Resource Blocks (RBs) in the frequency domain.

A slot includes a plurality of OFDM symbols in the time domain. Since OFDMA is adopted for DL in the 3GPP LTE system, one OFDM symbol represents one symbol period. An OFDM symbol may be called an SC-FDMA symbol or symbol period. An RB is a resource allocation unit including a plurality of contiguous subcarriers in one slot.

In a full FDD system, each of 10 subframes may be used simultaneously for DL transmission and UL transmission during a 10-ms duration. The DL transmission and the UL transmission are distinguished by frequency. On the other hand, a UE cannot perform transmission and reception simultaneously in a half FDD system.

The above radio frame structure is purely exemplary. Thus, the number of subframes in a radio frame, the number of slots in a subframe, and the number of OFDM symbols in a slot may be changed.

FIG. 2(b) illustrates frame structure type 2. Frame structure type 2 is applied to a Time Division Duplex (TDD) system. One radio frame is 10 ms (Tf=307200·Ts) long, including two half-frames each having a length of 5 ms (=153600·Ts) long. Each half-frame includes five subframes each being 1ms (=30720·Ts) long. An ith subframe includes 2ith and (2i+1)th slots each having a length of 0.5 ms (Tslot=15360·Ts). Ts is a sampling time given as Ts=1/(15 kHzx2048)=3.2552×10-8 (about 33 ns).

A type-2 frame includes a special subframe having three fields, Downlink Pilot Time Slot (DwPTS), Guard Period (GP), and Uplink Pilot Time Slot (UpPTS). The DwPTS is used for initial cell search, synchronization, or channel estimation at a UE, and the UpPTS is used for channel estimation and UL transmission synchronization with a UE at an eNB. The GP is used to cancel UL interference between a UL and a DL, caused by the multi-path delay of a DL signal.

[Table 1] below lists special subframe configurations (DwPTS/GP/UpPTS lengths).

TABLE 1

| | Normal cyclic prefix in downlink | | | Extended cyclic prefix in downlink | | |
|---|---|---|---|---|---|---|
| | | UpPTS | | | UpPTS | |
| Special subframe configuration | DwPTS | Normal cyclic prefix in uplink | Extended cyclic prefix in uplink | DwPTS | Normal cyclic prefix in uplink | Extended cyclic prefix in uplink |
| 0 | $6592 \cdot T_s$ | $2192 \cdot T_s$ | $2560 \cdot T_s$ | $7680 \cdot T_s$ | $2192 \cdot T_s$ | $2560 \cdot T_s$ |
| 1 | $19760 \cdot T_s$ | | | $20480 \cdot T_s$ | | |
| 2 | $21952 \cdot T_s$ | | | $23040 \cdot T_s$ | | |
| 3 | $24144 \cdot T_s$ | | | $25600 \cdot T_s$ | | |
| 4 | $26336 \cdot T_s$ | | | $7680 \cdot T_s$ | $4384 \cdot T_s$ | $5120 \cdot T_s$ |
| 5 | $6592 \cdot T_s$ | $4384 \cdot T_s$ | $5120 \cdot T_s$ | $20480 \cdot T_s$ | | |
| 6 | $19760 \cdot T_s$ | | | $23040 \cdot T_s$ | | |
| 7 | $21952 \cdot T_s$ | | | — | — | — |
| 8 | $24144 \cdot T_s$ | | | — | — | — |

Figure 3:
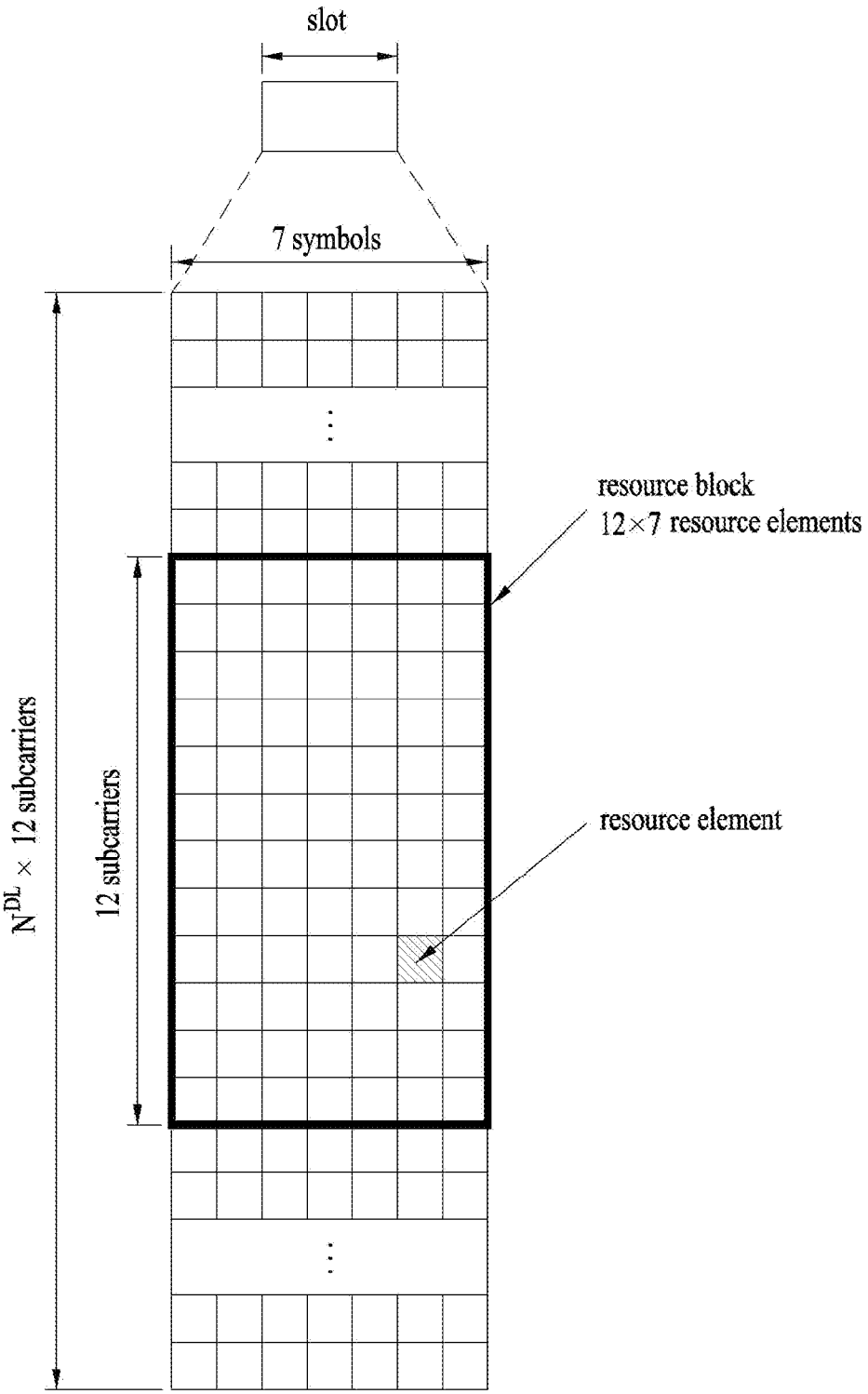
FIG. 3 is a diagram illustrating an example of a resource grid of a downlink slot according to the embodiments.

FIG. 3 illustrates an exemplary structure of a DL resource grid for the duration of one DL slot, which may be used in embodiments of the present disclosure.

Referring to FIG. 3, a DL slot includes a plurality of OFDM symbols in the time domain. One DL slot includes 7 OFDM symbols in the time domain and an RB includes 12 subcarriers in the frequency domain, to which the present disclosure is not limited.

Each element of the resource grid is referred to as a Resource Element (RE). An RB includes 12×7 REs. The number of RBs in a DL slot, NDL depends on a DL transmission bandwidth. A UL slot may have the same structure as a DL slot.

Figure 4:
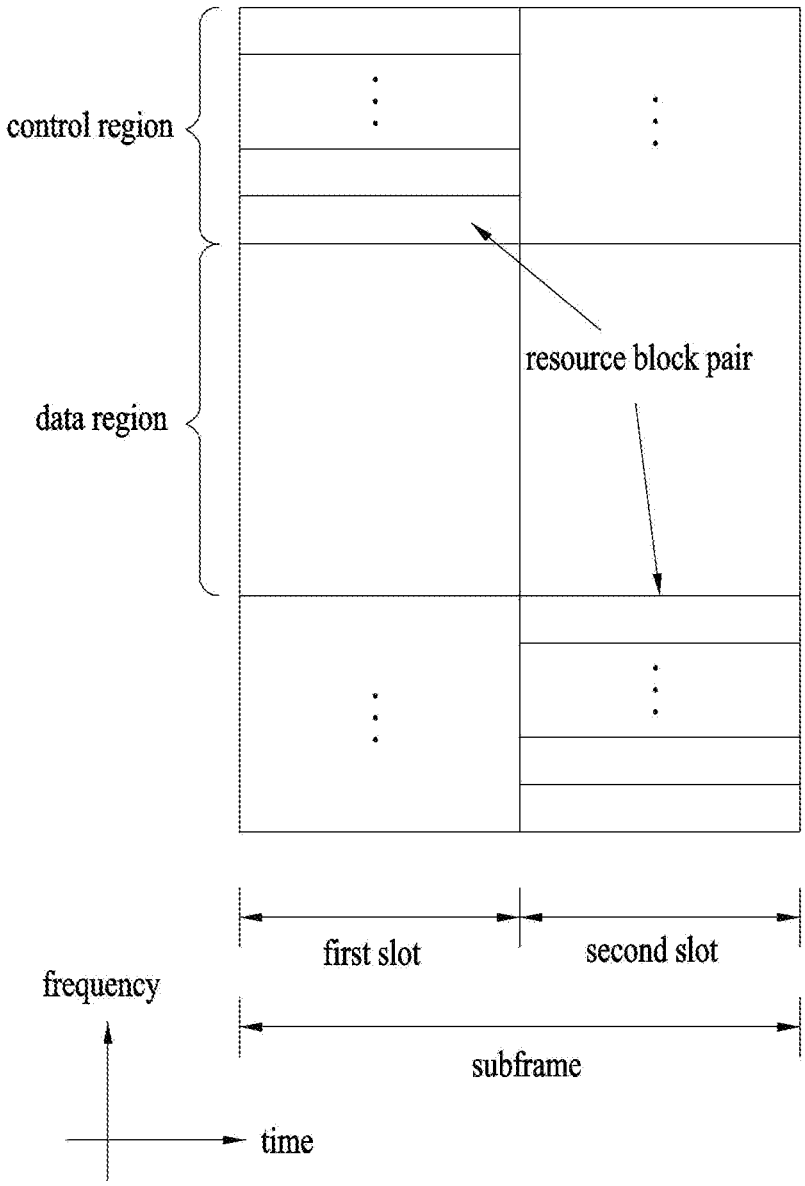
FIG. 4 is a diagram illustrating a structure of an uplink subframe according to the embodiments.

FIG. 4 illustrates a structure of a UL subframe which may be used in embodiments of the present disclosure.

Referring to FIG. 4, a UL subframe may be divided into a control region and a data region in the frequency domain. A PUCCH carrying UCI is allocated to the control region and a PUSCH carrying user data is allocated to the data region. To maintain a single carrier property, a UE does not transmit a PUCCH and a PUSCH simultaneously. A pair of RBs in a subframe are allocated to a PUCCH for a UE. The RBs of the RB pair occupy different subcarriers in two slots. Thus it is said that the RB pair frequency-hops over a slot boundary.

Figure 5:
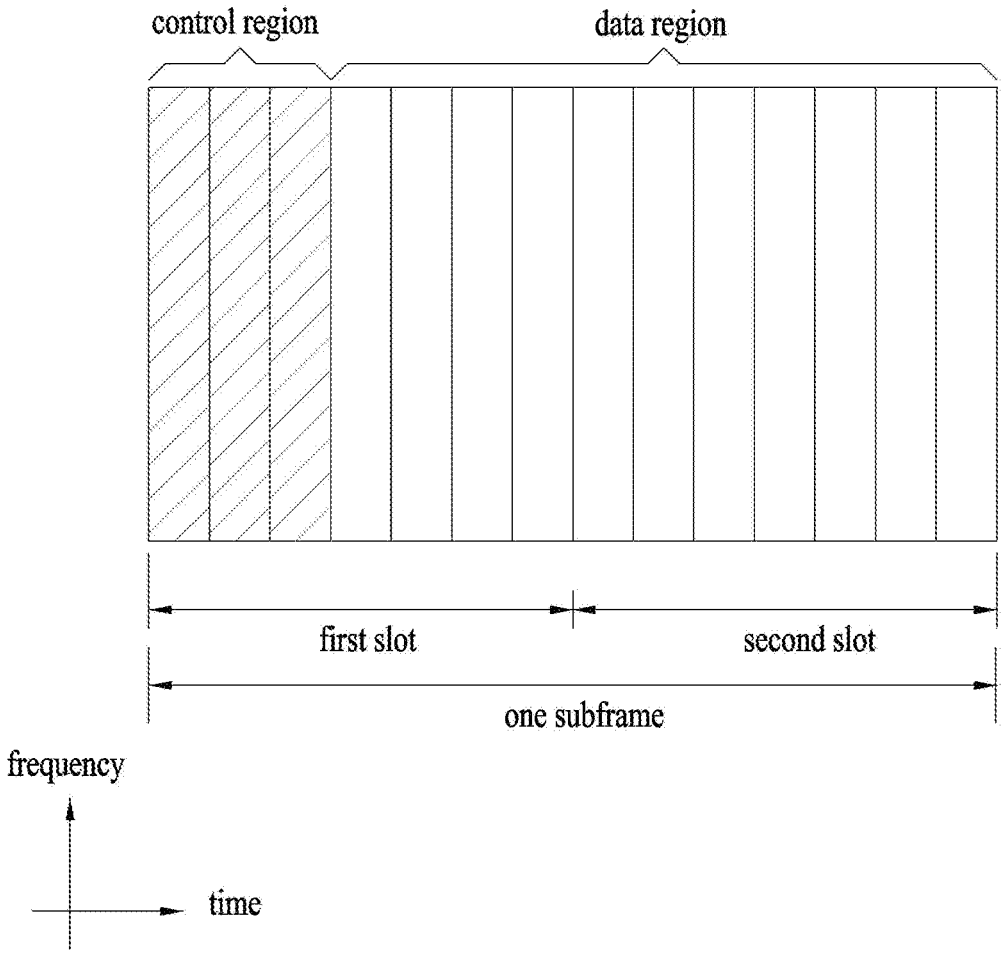
FIG. 5 is a diagram illustrating a structure of a downlink subframe according to the embodiments.

FIG. 5 illustrates a structure of a DL subframe that may be used in embodiments of the present disclosure.

Referring to FIG. 5, up to three OFDM symbols of a DL subframe, starting from OFDM symbol 0 are used as a control region to which control channels are allocated and the other OFDM symbols of the DL subframe are used as a data region to which a PDSCH is allocated. DL control channels defined for the 3GPP LTE system include a Physical Control Format Indicator Channel (PCFICH), a PDCCH, and a Physical Hybrid ARQ Indicator Channel (PHICH).

The PCFICH is transmitted in the first OFDM symbol of a subframe, carrying information about the number of OFDM symbols used for transmission of control channels (i.e. the size of the control region) in the subframe. The PHICH is a response channel to a UL transmission, delivering an HARQ ACK/NACK signal. Control information carried on the PDCCH is called Downlink Control Information (DCI). The DCI transports UL resource assignment information, DL resource assignment information, or UL Transmission (Tx) power control commands for a UE group.

1.2 Physical Downlink Control Channel (PDCCH)

1.2.1 PDCCH Overview

The PDCCH may deliver information about resource allocation and a transport format for a Downlink Shared Channel (DL-SCH) (i.e. a DL grant), information about resource allocation and a transport format for an Uplink Shared Channel (UL-SCH) (i.e. a UL grant), paging information of a Paging Channel (PCH), system information on the DL-SCH, information about resource allocation for a higher-layer control message such as a random access response transmitted on the PDSCH, a set of Tx power control commands for individual UEs of a UE group, Voice Over Internet Protocol (VoIP) activation indication information, etc.

A plurality of PDCCHs may be transmitted in the control region. A UE may monitor a plurality of PDCCHs. A PDCCH is transmitted in an aggregate of one or more consecutive Control Channel Elements (CCEs). A PDCCH made up of one or more consecutive CCEs may be transmitted in the control region after subblock interleaving. A CCE is a logical allocation unit used to provide a PDCCH at a code rate based on the state of a radio channel. A CCE includes a plurality of RE Groups (REGs). The format of a PDCCH and the number of available bits for the PDCCH are determined according to the relationship between the number of CCEs and a code rate provided by the CCEs.

1.2.2 PDCCH Structure

A plurality of PDCCHs for a plurality of UEs may be multiplexed and transmitted in the control region. A PDCCH is made up of an aggregate of one or more consecutive CCEs. A CCE is a unit of 9 REGs each REG including 4 REs. Four Quadrature Phase Shift Keying (QPSK) symbols are mapped to each REG. REs occupied by RS s are excluded from REGs. That is, the total number of REGs in an OFDM symbol may be changed depending on the presence or absence of a cell-specific RS. The concept of an REG to which four REs are mapped is also applicable to other DL control channels (e.g. the PCFICH or the PHICH). Let the number of REGs that are not allocated to the PCFICH or the PHICH be denoted by NREG. Then the number of CCEs available to the system is NCCE(=$\lfloor N_{REG}/9 \rfloor$) and the CCEs are indexed from 0 to NCCE−1.

To simplify the decoding process of a UE, a PDCCH format including n CCEs may start with a CCE having an index equal to a multiple of n. That is, given CCE i, the PDCCH format may start with a CCE satisfying i mod n=0.

The eNB may configure a PDCCH with 1, 2, 4, or 8 CCEs. {1, 2, 4, 8} are called CCE aggregation levels. The number of CCEs used for transmission of a PDCCH is determined according to a channel state by the eNB. For example, one CCE is sufficient for a PDCCH directed to a UE in a good DL channel state (a UE near to the eNB). On the other hand, 8 CCEs may be required for a PDCCH directed to a UE in a poor DL channel state (a UE at a cell edge) in order to ensure sufficient robustness.

[Table 2] below illustrates PDCCH formats. 4 PDCCH formats are supported according to CCE aggregation levels as illustrated in [Table 2].

TABLE 2

| PDCCH format | Number of CCEs (n) | Number of REGs | Number of PDCCH bits |
|---|---|---|---|
| 0 | 1 | 9 | 72 |
| 1 | 2 | 18 | 144 |

TABLE 2-continued

| PDCCH format | Number of CCEs (n) | Number of REGs | Number of PDCCH bits |
|---|---|---|---|
| 2 | 4 | 36 | 288 |
| 3 | 8 | 72 | 576 |

A different CCE aggregation level is allocated to each UE because the format or Modulation and Coding Scheme (MCS) level of control information delivered in a PDCCH for the UE is different. An MCS level defines a code rate used for data coding and a modulation order. An adaptive MCS level is used for link adaptation. In general, three or four MCS levels may be considered for control channels carrying control information.

Regarding the formats of control information, control information transmitted on a PDCCH is called DCI. The configuration of information in PDCCH payload may be changed depending on the DCI format. The PDCCH payload is information bits. [Table 3] lists DCI according to DCI formats.

TABLE 3

| DCI Format | Description |
|---|---|
| Format 0 | Resource grants for the PUSCH transmissions (uplink) |
| Format 1 | Resource assignments for single codeword PDSCH transmissions (transmission modes 1, 2 and 7) |
| Format 1A | Compact signaling of resource assignments for single codeword PDSCH (all modes) |
| Format 1B | Compact resource assignments for PDSCH using rank-1 closed loop precoding (mode 6) |
| Format 1C | Very compact resource assignments for PDSCH (e.g. paging/broadcast system information) |
| Format 1D | Compact resource assignments for PDSCH using multi-user MIMO (mode 5) |
| Format 2 | Resource assignments for PDSCH for closed-loop MIMO operation (mode 4) |
| Format 2A | Resource assignments for PDSCH for open-loop MIMO operation (mode 3) |
| Format 3/3A | Power control commands for PUCCH and PUSCH with 2-bit/1-bit power adjustment |
| Format 4 | Scheduling of PUSCH in one UL cell with multi-antenna port transmission mode |

Referring to [Table 3], the DCI formats include Format 0 for PUSCH scheduling, Format 1 for single-codeword PDSCH scheduling, Format 1A for compact single-codeword PDSCH scheduling, Format 1C for very compact DL-SCH scheduling, Format 2 for PDSCH scheduling in a closed-loop spatial multiplexing mode, Format 2A for PDSCH scheduling in an open-loop spatial multiplexing mode, and Format 3/3A for transmission of Transmission Power Control (TPC) commands for uplink channels. DCI Format 1A is available for PDSCH scheduling irrespective of the transmission mode of a UE.

The length of PDCCH payload may vary with DCI formats. In addition, the type and length of PDCCH payload may be changed depending on compact or non-compact scheduling or the transmission mode of a UE.

The transmission mode of a UE may be configured for DL data reception on a PDSCH at the UE. For example, DL data carried on a PDSCH includes scheduled data, a paging message, a random access response, broadcast information on a BCCH, etc. for a UE. The DL data of the PDSCH is related to a DCI format signaled through a PDCCH. The transmission mode may be configured semi-statically for the UE by higher-layer signaling (e.g. Radio Resource Control (RRC) signaling). The transmission mode may be classified as single antenna transmission or multi-antenna transmission.

A transmission mode is configured for a UE semi-statically by higher-layer signaling. For example, multi-antenna transmission scheme may include transmit diversity, open-loop or closed-loop spatial multiplexing, Multi-User Multiple Input Multiple Output (MU-MIMO), or beamforming. Transmit diversity increases transmission reliability by transmitting the same data through multiple Tx antennas. Spatial multiplexing enables high-speed data transmission without increasing a system bandwidth by simultaneously transmitting different data through multiple Tx antennas. Beamforming is a technique of increasing the Signal to Interference plus Noise Ratio (SINR) of a signal by weighting multiple antennas according to channel states.

A DCI format for a UE depends on the transmission mode of the UE. The UE has a reference DCI format monitored according to the transmission mode configure for the UE. The following 10 transmission modes are available to UEs:

(1) Transmission mode 1: Single antenna port (port 0);

(2) Transmission mode 2: Transmit diversity;

(3) Transmission mode 3: Open-loop spatial multiplexing when the number of layer is larger than 1 or Transmit diversity when the rank is 1;

(4) Transmission mode 4: Closed-loop spatial multiplexing;

(5) Transmission mode 5: MU-MIMO;

(6) Transmission mode 6: Closed-loop rank-1 precoding;

(7) Transmission mode 7: Precoding supporting a single layer transmission, which does not based on a codebook (Rel-8);

(8) Transmission mode 8: Precoding supporting up to two layers, which do not based on a codebook (Rel-9);

(9) Transmission mode 9: Precoding supporting up to eight layers, which do not based on a codebook (Rel-10); and

(10) Transmission mode 10: Precoding supporting up to eight layers, which do not based on a codebook, used for CoMP (Rel-11).

1.2.3 PDCCH Transmission

The eNB determines a PDCCH format according to DCI that will be transmitted to the UE and adds a Cyclic Redundancy Check (CRC) to the control information. The CRC is masked by a unique Identifier (ID) (e.g. a Radio Network Temporary Identifier (RNTI)) according to the owner or usage of the PDCCH. If the PDCCH is destined for a specific UE, the CRC may be masked by a unique ID (e.g. a cell-RNTI (C-RNTI)) of the UE. If the PDCCH carries a paging message, the CRC of the PDCCH may be masked by a paging indicator ID (e.g. a Paging-RNTI (P-RNTI)). If the PDCCH carries system information, particularly, a System Information Block (SIB), its CRC may be masked by a system information ID (e.g. a System Information RNTI (SI-RNTI)). To indicate that the PDCCH carries a random access response to a random access preamble transmitted by a UE, its CRC may be masked by a Random Access-RNTI (RA-RNTI).

Then the eNB generates coded data by channel-encoding the CRC-added control information. The channel coding may be performed at a code rate corresponding to an MCS level. The eNB rate-matches the coded data according to a CCE aggregation level allocated to a PDCCH format and generates modulation symbols by modulating the coded data. Herein, a modulation order corresponding to the MCS level may be used for the modulation. The CCE aggregation level for the modulation symbols of a PDCCH may be one of 1, 2, 4, and 8. Subsequently, the eNB maps the modulation symbols to physical REs (i.e. CCE to RE mapping).

1.2.4 Blind Decoding (BD)

A plurality of PDCCHs may be transmitted in a subframe. That is, the control region of a subframe includes a plurality of CCEs, CCE 0 to CCE NCCE,k−1. NCCE,k is the total number of CCEs in the control region of a kth subframe. A UE monitors a plurality of PDCCHs in every subframe. This means that the UE attempts to decode each PDCCH according to a monitored PDCCH format.

The eNB does not provide the UE with information about the position of a PDCCH directed to the UE in an allocated control region of a subframe. Without knowledge of the position, CCE aggregation level, or DCI format of its PDCCH, the UE searches for its PDCCH by monitoring a set of PDCCH candidates in the subframe in order to receive a control channel from the eNB. This is called blind decoding. Blind decoding is the process of demasking a CRC part with a UE ID, checking a CRC error, and determining whether a corresponding PDCCH is a control channel directed to a UE by the UE.

The UE monitors a PDCCH in every subframe to receive data transmitted to the UE in an active mode. In a Discontinuous Reception (DRX) mode, the UE wakes up in a monitoring interval of every DRX cycle and monitors a PDCCH in a subframe corresponding to the monitoring interval. The PDCCH-monitored subframe is called a non-DRX subframe.

To receive its PDCCH, the UE should blind-decode all CCEs of the control region of the non-DRX subframe. Without knowledge of a transmitted PDCCH format, the UE should decode all PDCCHs with all possible CCE aggregation levels until the UE succeeds in blind-decoding a PDCCH in every non-DRX subframe. Since the UE does not know the number of CCEs used for its PDCCH, the UE should attempt detection with all possible CCE aggregation levels until the UE succeeds in blind decoding of a PDCCH.

In the LTE system, the concept of Search Space (SS) is defined for blind decoding of a UE. An SS is a set of PDCCH candidates that a UE will monitor. The SS may have a different size for each PDCCH format. There are two types SSs, Common Search Space (CSS) and UE-specific/Dedicated Search Space (USS).

While all UEs may know the size of a CSS, a USS may be configured for each individual UE. Accordingly, a UE should monitor both a CSS and a USS to decode a PDCCH. As a consequence, the UE performs up to 44 blind decodings in one subframe, except for blind decodings based on different CRC values (e.g., C-RNTI, P-RNTI, SI-RNTI, and RA-RNTI).

In view of the constraints of an SS, the eNB may not secure CCE resources to transmit PDCCHs to all intended UEs in a given subframe. This situation occurs because the remaining resources except for allocated CCEs may not be included in an SS for a specific UE. To minimize this obstacle that may continue in the next subframe, a UE-specific hopping sequence may apply to the starting point of a USS.

[Table 4] illustrates the sizes of CSSs and USSs.

TABLE 4

| PDCCH format | Number of CCEs (n) | Number of candidates in common search space | Number of candidates in dedicated search space |
|---|---|---|---|
| 0 | 1 | — | 6 |
| 1 | 2 | — | 6 |

TABLE 4-continued

| PDCCH format | Number of CCEs (n) | Number of candidates in common search space | Number of candidates in dedicated search space |
|---|---|---|---|
| 2 | 4 | 4 | 2 |
| 3 | 8 | 2 | 2 |

To mitigate the load of the UE caused by the number of blind decoding attempts, the UE does not search for all defined DCI formats simultaneously. Specifically, the UE always searches for DCI Format 0 and DCI Format 1A in a USS. Although DCI Format 0 and DCI Format 1A are of the same size, the UE may distinguish the DCI formats by a flag for format0/format 1a differentiation included in a PDCCH. Other DCI formats than DCI Format 0 and DCI Format 1A, such as DCI Format 1, DCI Format 1B, and DCI Format 2 may be required for the UE.

The UE may search for DCI Format 1A and DCI Format 1C in a CSS. The UE may also be configured to search for DCI Format 3 or 3A in the CSS. Although DCI Format 3 and DCI Format 3A have the same size as DCI Format 0 and DCI Format 1A, the UE may distinguish the DCI formats by a CRC scrambled with an ID other than a UE-specific ID.

An $SS_k^{(L)}$ is a PDCCH candidate set with a CCE aggregation level $L \in \{1,2,4,8\}$. The CCEs of PDCCH candidate set m in the SS may be determined by the following equation.

$$L \cdot \{(Y_k + m) \bmod \lfloor N_{CCE,k}/L \rfloor\} + i \qquad \text{[Equation 1]}$$

where $M^{(L)}$ is the number of PDCCH candidates with CCE aggregation level L to be monitored in the SS, $m=0, \ldots M^{(L)}-1$, i is the index of a CCE in each PDCCH candidate, and $i=0, L-1$. $k=\lfloor n_s/2 \rfloor$ where $n_s$ is the index of a slot in a radio frame.

As described before, the UE monitors both the USS and the CSS to decode a PDCCH. The CSS supports PDCCHs with CCE aggregation levels {4, 8} and the USS supports PDCCHs with CCE aggregation levels {1, 2, 4, 8}. [Table 5] illustrates PDCCH candidates monitored by a UE.

TABLE 5

| Type | Search space $S_k^{(L)}$ Aggregation level L | Size [in CCEs] | Number of PDCCH candidates $M^{(L)}$ |
|---|---|---|---|
| UE-specific | 1 | 6 | 6 |
| | 2 | 12 | 6 |
| | 4 | 8 | 2 |
| | 8 | 16 | 2 |
| Common | 4 | 16 | 4 |
| | 8 | 16 | 2 |

Referring to [Equation 1], for two aggregation levels, L=4 and L=8, $Y_k$ is set to 0 in the CSS, whereas $Y_k$ is defined by [Equation 2] for aggregation level L in the USS.

$$Y_k = (A \cdot Y_{k-1} \bmod D \qquad \text{[Equation 2]}$$

where $Y_{-1}=n_{RNTI} \neq 0$, $n_{RNTI}$ indicating an RNTI value. A=39827 and D=65537.

1.3 Carrier Aggregation (CA) Environment 1.3.1 CA Overview

A 3GPP LTE system (conforming to Rel-8 or Rel-9) (hereinafter, referred to as an LTE system) uses Multi-Carrier Modulation (MCM) in which a single Component Carrier (CC) is divided into a plurality of bands. In contrast, a 3GPP LTE-A system (hereinafter, referred to an LTE-A system) may use CA by aggregating one or more CCs to support a broader system bandwidth than the LTE system. The term CA is interchangeably used with carrier combining, multi-CC environment, or multi-carrier environment.

In the present disclosure, multi-carrier means CA (or carrier combining). Herein, CA covers aggregation of contiguous carriers and aggregation of non-contiguous carriers. The number of aggregated CCs may be different for a DL and a UL. If the number of DL CCs is equal to the number of UL CCs, this is called symmetric aggregation. If the number of DL CCs is different from the number of UL CCs, this is called asymmetric aggregation. The term CA is interchangeable with carrier combining, bandwidth aggregation, spectrum aggregation, etc.

The LTE-A system aims to support a bandwidth of up to 100 MHz by aggregating two or more CCs, that is, by CA. To guarantee backward compatibility with a legacy IMT system, each of one or more carriers, which has a smaller bandwidth than a target bandwidth, may be limited to a bandwidth used in the legacy system.

For example, the legacy 3GPP LTE system supports bandwidths {1.4, 3, 5, 10, 15, and 20 MHz} and the 3GPP LTE-A system may support a broader bandwidth than 20 MHz using these LTE bandwidths. A CA system of the present disclosure may support CA by defining a new bandwidth irrespective of the bandwidths used in the legacy system.

There are two types of CA, intra-band CA and inter-band CA. Intra-band CA means that a plurality of DL CCs and/or UL CCs are successive or adjacent in frequency. In other words, the carrier frequencies of the DL CCs and/or UL CCs are positioned in the same band. On the other hand, an environment where CCs are far away from each other in frequency may be called inter-band CA. In other words, the carrier frequencies of a plurality of DL CCs and/or UL CCs are positioned in different bands. In this case, a UE may use a plurality of Radio Frequency (RF) ends to conduct communication in a CA environment.

The LTE-A system adopts the concept of cell to manage radio resources. The above-described CA environment may be referred to as a multi-cell environment. A cell is defined as a pair of DL and UL CCs, although the UL resources are not mandatory. Accordingly, a cell may be configured with DL resources alone or DL and UL resources.

For example, if one serving cell is configured for a specific UE, the UE may have one DL CC and one UL CC. If two or more serving cells are configured for the UE, the UE may have as many DL CCs as the number of the serving cells and as many UL CCs as or fewer UL CCs than the number of the serving cells, or vice versa. That is, if a plurality of serving cells are configured for the UE, a CA environment using more UL CCs than DL CCs may also be supported.

CA may be regarded as aggregation of two or more cells having different carrier frequencies (center frequencies). Herein, the term 'cell' should be distinguished from 'cell' as a geographical area covered by an eNB. Hereinafter, intra-band CA is referred to as intra-band multi-cell and inter-band CA is referred to as inter-band multi-cell.

In the LTE-A system, a Primacy Cell (PCell) and a Secondary Cell (SCell) are defined. A PCell and an SCell may be used as serving cells. For a UE in RRC_CONNECTED state, if CA is not configured for the UE or the UE does not support CA, a single serving cell including only a PCell exists for the UE. On the contrary, if the UE is in RRC_CONNECTED state and CA is configured for the UE, one or more serving cells may exist for the UE, including a PCell and one or more SCells.

Serving cells (PCell and SCell) may be configured by an RRC parameter. A physical-layer ID of a cell, PhysCellId is an integer value ranging from 0 to 503. A short ID of an SCell, SCellIndex is an integer value ranging from 1 to 7. A short ID of a serving cell (PCell or SCell), ServeCellIndex is an integer value ranging from 1 to 7. If ServeCellIndex is 0, this indicates a PCell and the values of ServeCellIndex for SCells are pre-assigned. That is, the smallest cell ID (or cell index) of ServeCellIndex indicates a PCell.

A PCell refers to a cell operating in a primary frequency (or a primary CC). A UE may use a PCell for initial connection establishment or connection reestablishment. The PCell may be a cell indicated during handover. In addition, the PCell is a cell responsible for control-related communication among serving cells configured in a CA environment. That is, PUCCH allocation and transmission for the UE may take place only in the PCell. In addition, the UE may use only the PCell in acquiring system information or changing a monitoring procedure. An Evolved Universal Terrestrial Radio Access Network (E-UTRAN) may change only a PCell for a handover procedure by a higher-layer RRCConnectionReconfiguraiton message including mobilityControlInfo to a UE supporting CA.

An SCell may refer to a cell operating in a secondary frequency (or a secondary CC). Although only one PCell is allocated to a specific UE, one or more SCells may be allocated to the UE. An SCell may be configured after RRC connection establishment and may be used to provide additional radio resources. There is no PUCCH in cells other than a PCell, that is, in SCells among serving cells configured in the CA environment.

When the E-UTRAN adds an SCell to a UE supporting CA, the E-UTRAN may transmit all system information related to operations of related cells in RRC_CONNECTED state to the UE by dedicated signaling. Changing system information may be controlled by releasing and adding a related SCell. Herein, a higher-layer RRCConnectionReconfiguration message may be used. The E-UTRAN may transmit a dedicated signal having a different parameter for each cell rather than it broadcasts in a related SCell.

After an initial security activation procedure starts, the E-UTRAN may configure a network including one or more SCells by adding the SCells to a PCell initially configured during a connection establishment procedure. In the CA environment, each of a PCell and an SCell may operate as a CC. Hereinbelow, a Primary CC (PCC) and a PCell may be used in the same meaning and a Secondary CC (SCC) and an SCell may be used in the same meaning in embodiments of the present disclosure.

Figure 6:
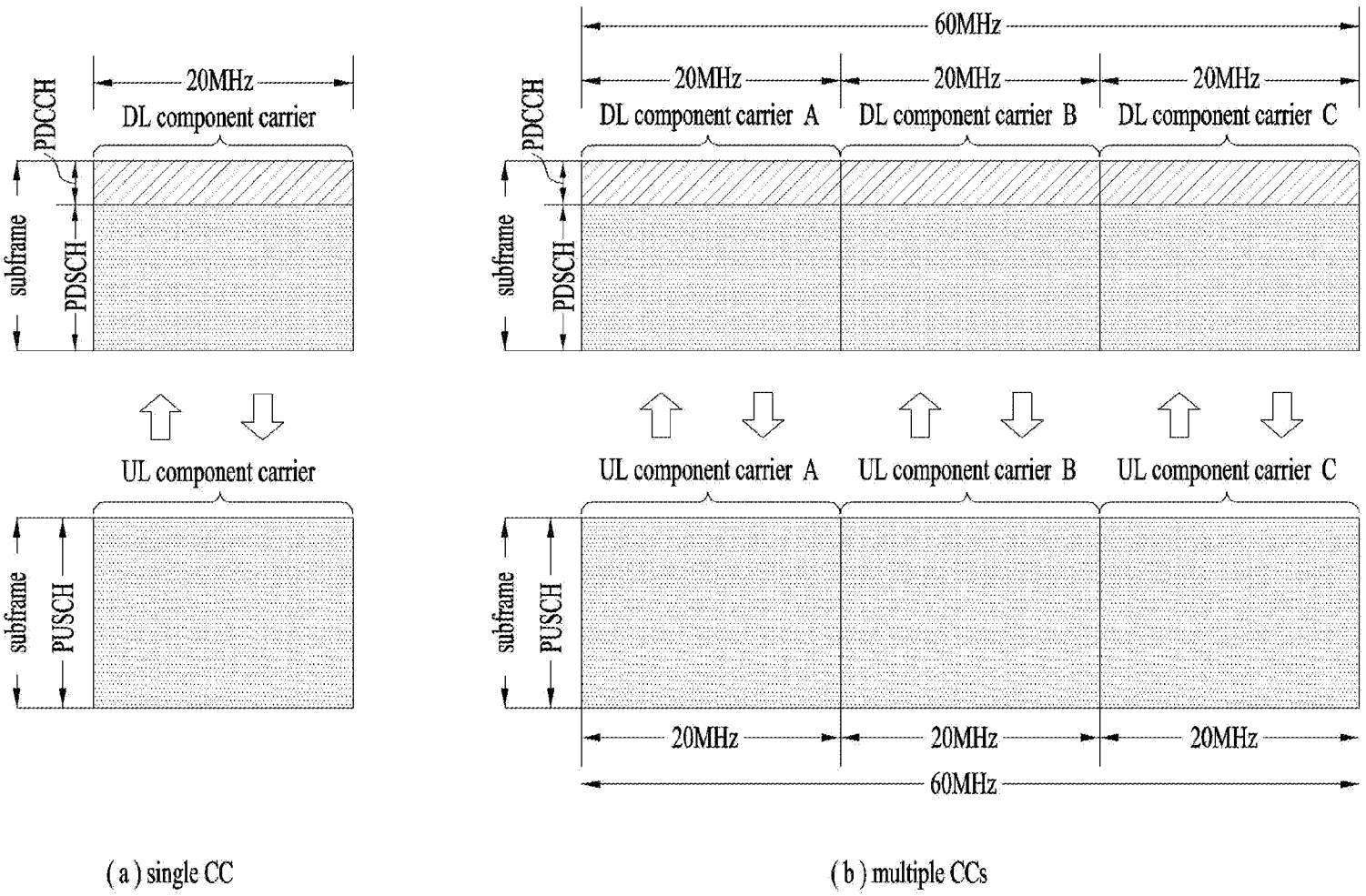
FIG. 6 is a diagram illustrating an example of a component carrier (CC) used in the embodiments of the present invention and carrier aggregation used in an LTE-A system.

FIG. 6 illustrates an example of CCs and CA in the LTE-A system, which are used in embodiments of the present disclosure.

FIG. 6(a) illustrates a single carrier structure in the LTE system. There are a DL CC and a UL CC and one CC may have a frequency range of 20 MHz.

FIG. 6(b) illustrates a CA structure in the LTE-A system. In the illustrated case of FIG. 6(b), three CCs each having 20 MHz are aggregated. While three DL CCs and three UL CCs are configured, the numbers of DL CCs and UL CCs are not limited. In CA, a UE may monitor three CCs simultaneously, receive a DL signal/DL data in the three CCs, and transmit a UL signal/UL data in the three CCs.

If a specific cell manages N DL CCs, the network may allocate M (M≤N) DL CCs to a UE. The UE may monitor only the M DL CCs and receive a DL signal in the M DL CCs. The network may prioritize L (L≤M≤N) DL CCs and allocate a main DL CC to the UE. In this case, the UE should monitor the L DL CCs. The same thing may apply to UL transmission.

The linkage between the carrier frequencies of DL resources (or DL CCs) and the carrier frequencies of UL resources (or UL CCs) may be indicated by a higher-layer message such as an RRC message or by system information. For example, a set of DL resources and UL resources may be configured based on linkage indicated by System Information Block Type 2 (SIB2). Specifically, DL-UL linkage may refer to a mapping relationship between a DL CC carrying a PDCCH with a UL grant and a UL CC using the UL grant, or a mapping relationship between a DL CC (or a UL CC) carrying HARQ data and a UL CC (or a DL CC) carrying an HARQ ACK/NACK signal.

1.3.2 Cross Carrier Scheduling

Two scheduling schemes, self-scheduling and cross carrier scheduling are defined for a CA system, from the perspective of carriers or serving cells. Cross carrier scheduling may be called cross CC scheduling or cross cell scheduling.

In self-scheduling, a PDCCH (carrying a DL grant) and a PDSCH are transmitted in the same DL CC or a PUSCH is transmitted in a UL CC linked to a DL CC in which a PDCCH (carrying a UL grant) is received.

In cross carrier scheduling, a PDCCH (carrying a DL grant) and a PDSCH are transmitted in different DL CCs or a PUSCH is transmitted in a UL CC other than a UL CC linked to a DL CC in which a PDCCH (carrying a UL grant) is received.

Cross carrier scheduling may be activated or deactivated UE-specifically and indicated to each UE semi-statically by higher-layer signaling (e.g. RRC signaling).

If cross carrier scheduling is activated, a Carrier Indicator Field (CIF) is required in a PDCCH to indicate a DL/UL CC in which a PDSCH/PUSCH indicated by the PDCCH is to be transmitted. For example, the PDCCH may allocate PDSCH resources or PUSCH resources to one of a plurality of CCs by the CIF. That is, when a PDCCH of a DL CC allocates PDSCH or PUSCH resources to one of aggregated DL/UL CCs, a CIF is set in the PDCCH. In this case, the DCI formats of LTE Release-8 may be extended according to the CIF. The CIF may be fixed to three bits and the position of the CIF may be fixed irrespective of a DCI format size. In addition, the LTE Release-8 PDCCH structure (the same coding and resource mapping based on the same CCEs) may be reused.

On the other hand, if a PDCCH transmitted in a DL CC allocates PDSCH resources of the same DL CC or allocates PUSCH resources in a single UL CC linked to the DL CC, a CIF is not set in the PDCCH. In this case, the LTE Release-8 PDCCH structure (the same coding and resource mapping based on the same CCEs) may be used.

If cross carrier scheduling is available, a UE needs to monitor a plurality of PDCCHs for DCI in the control region of a monitoring CC according to the transmission mode and/or bandwidth of each CC. Accordingly, an appropriate SS configuration and PDCCH monitoring are needed for the purpose.

In the CA system, a UE DL CC set is a set of DL CCs scheduled for a UE to receive a PDSCH, and a UE UL CC set is a set of UL CCs scheduled for a UE to transmit a PUSCH. A PDCCH monitoring set is a set of one or more DL CCs in which a PDCCH is monitored. The PDCCH monitoring set may be identical to the UE DL CC set or may be a subset of the UE DL CC set. The PDCCH monitoring set may include at least one of the DL CCs of the UE DL CC set. Or the PDCCH monitoring set may be defined irrespective of the UE DL CC set. DL CCs included in the PDCCH monitoring set may be configured to always enable self-scheduling for UL CCs linked to the DL CCs. The UE DL CC set, the UE UL CC set, and the PDCCH monitoring set may be configured UE-specifically, UE group-specifically, or cell-specifically.

If cross carrier scheduling is deactivated, this implies that the PDCCH monitoring set is always identical to the UE DL CC set. In this case, there is no need for signaling the PDCCH monitoring set. However, if cross carrier scheduling is activated, the PDCCH monitoring set may be defined within the UE DL CC set. That is, the eNB transmits a PDCCH only in the PDCCH monitoring set to schedule a PDSCH or PUSCH for the UE.

Figure 7:
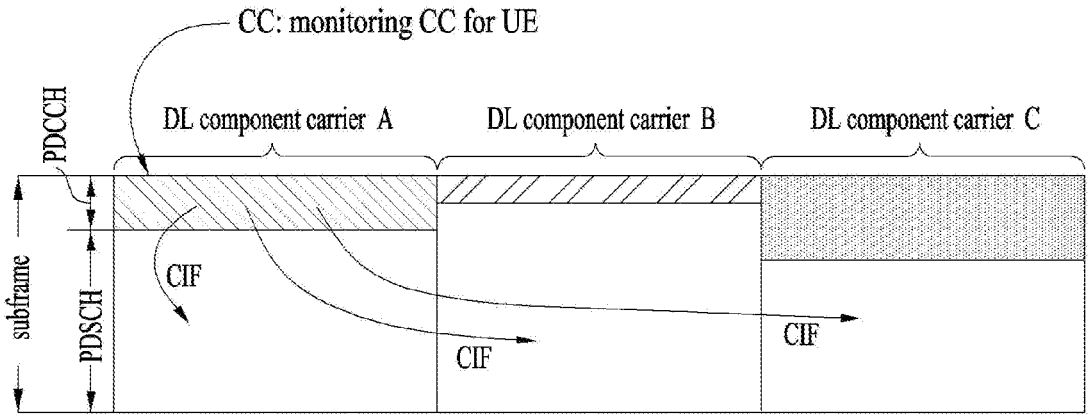
FIG. 7 is a diagram illustrating a subframe frame structure of an LTE-A system according to cross carrier scheduling used in the embodiments of the present invention.

FIG. 7 illustrates a cross carrier-scheduled subframe structure in the LTE-A system, which is used in embodiments of the present disclosure.

Referring to FIG. 7, three DL CCs are aggregated for a DL subframe for LTE-A UEs. DL CC 'A' is configured as a PDCCH monitoring DL CC. If a CIF is not used, each DL CC may deliver a PDCCH that schedules a PDSCH in the same DL CC without a CIF. On the other hand, if the CIF is used by higher-layer signaling, only DL CC 'A' may carry a PDCCH that schedules a PDSCH in the same DL CC 'A' or another CC. Herein, no PDCCH is transmitted in DL CC 'B' and DL CC 'C' that are not configured as PDCCH monitoring DL CCs.

2. Control Signal Transmission Through PUCCH (Physical Uplink Control Channel)

The PUCCH is an uplink control channel used to transmit uplink control information (UCI). The UCI transmitted on the PUCCH includes scheduling request (SR) information, HARQ ACK/NACK information and CQI information.

The amount of control information which a UE can transmit in a subframe depends on the number of SC-FDMA symbols available for transmission of control signaling data (at this time, excluding SC-FDMA symbols used for transmission of reference signals used for coherent detection of the PUCCH). The LTE/LTE-A system supports 7 different PUCCH formats depending on information which will be signaled on the PUCCH.

PUCCH may include the following formats to transmit control information.

(1) Format 1: On-Off keying (OOK) modulation, used for SR (Scheduling Request)

(2) Format 1a & 1b: Used for ACK/NACK transmission

1) Format 1a: BPSK ACK/NACK for 1 codeword

2) Format 1b: QPSK ACK/NACK for 2 codewords (3) Format 2: QPSK modulation, used for CQI transmission (4) Format 2a & Format 2b: Used for simultaneous transmission of CQI and ACK/NACK (5) Format 3: Used for multiple ACK/NACK transmission in a carrier aggregation environment Table 6 shows a modulation scheme according to PUCCH format and the number of bits per subframe. Table 7 shows the number of reference signals (RS) per slot according to PUCCH format. Table 8 shows SC-FDMA symbol location of RS (reference signal) according to PUCCH format. In Table 6, PUCCH format 2a and PUCCH format 2b correspond to a case of normal cyclic prefix (CP).

TABLE 6

| PUCCH format | Modulation scheme | No. of bits per subframe, Mbit |
|---|---|---|
| 1 | N/A | N/A |
| 1a | BPSK | 1 |
| 1b | QPSK | 2 |
| 2 | QPSK | 20 |
| 2a | QPSK + BPSK | 21 |
| 2b | QPSK + BPSK | 22 |
| 3 | QPSK | 48 |

TABLE 7

| PUCCH format | Normal CP | Extended CP |
|---|---|---|
| 1, 1a, 1b | 3 | 2 |
| 2, 3 | 2 | 1 |
| 2a, 2b | 2 | N/A |

TABLE 8

| | SC-FDMA symbol location of RS | |
|---|---|---|
| PUCCH format | Normal CP | Extended CP |
| 1, 1a, 1b | 2, 3, 4 | 2, 3 |
| 2, 3 | 1, 5 | 3 |
| 2a, 2b | 1, 5 | N/A |

Figure 8:
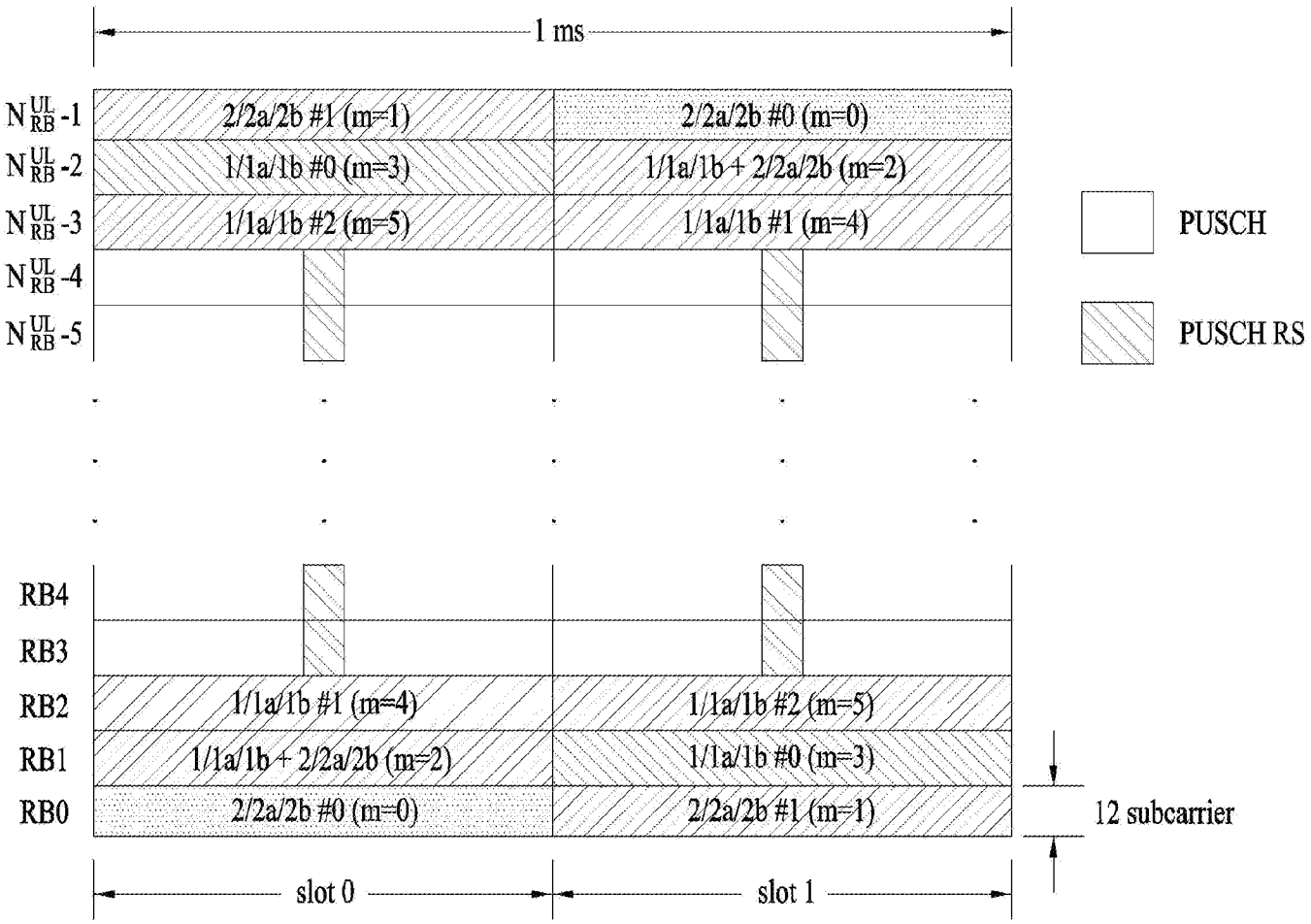
FIG. 8 is a diagram illustrating physical mapping of a PUCCH format into PUCCH RBs.

FIG. 8 is a diagram illustrating physical mapping of a PUCCH format into PUCCH RBs.

Referring to FIG. 8, PUCCH formats 2/2a/2b are mapped and allocated to edge RBs of a PUCCH band (for example, PUCCH region m=0, 1), and then PUCCH RB where PUCCH formats 2/2a/2b are combined with PUCCH formats 1/1a/1b is allocated (for example, PUCCH region m=2). Next, the PUCCH formats 1/1a/1b are allocated to the PUCCH RBs (for example, PUCCH region m=3, 4, 5). Information on the number $N_{RB}^{(2)}$ of PUCCH RBs used for the PUCCH formats 2/2a/2b is transferred from the cell to the UEs by a broadcast signal. FIG. 8 illustrates an example of PUCCH formats which are allocated, wherein the PUCCH formats actually mapped onto the PUCCH can be allocated sequentially in accordance with the aforementioned order.

2.1 CQI Transmission Through PUCCH Format

Figure 9:
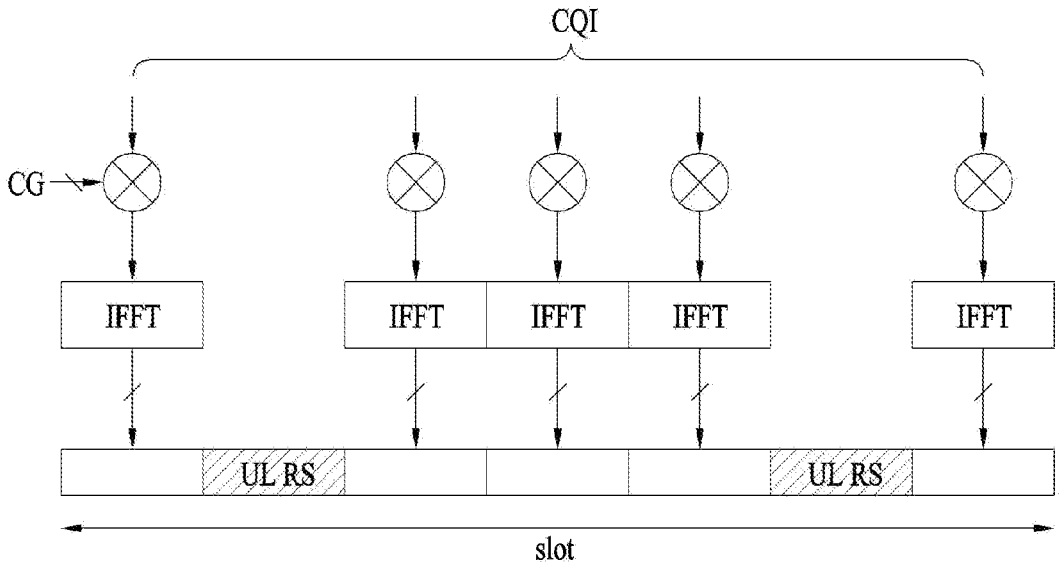
FIG. 9 is a diagram illustrating PUCCH formats 2/2a/2b in case of a normal cyclic prefix.
Figure 10:
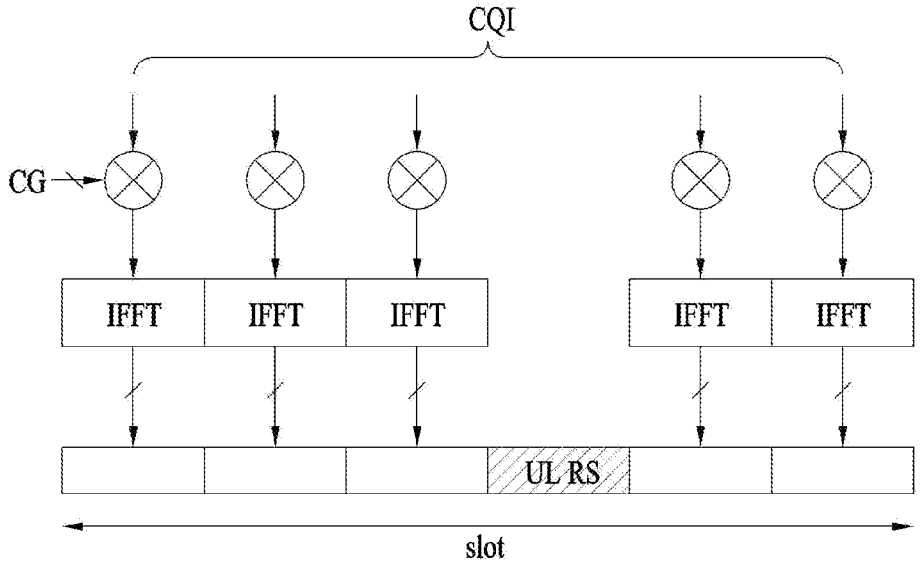
FIG. 10 is a diagram illustrating PUCCH formats 2/2a/2b in case of an extended cyclic prefix.

FIG. 9 is a diagram illustrating PUCCH formats 2/2a/2b in case of a normal cyclic prefix, and FIG. 10 is a diagram illustrating PUCCH formats 2/2a/2b in case of an extended cyclic prefix.

The periodicity and frequency resolution used by a UE to report CQI are both controlled by the eNB. In the time domain, both periodic and aperiodic CQI reporting are supported. The PUCCH format 2 is used for periodic CQI reporting only, and the PUSCH is used for aperiodic reporting of the CQI. At this time, the eNB especially commands CQI reporting to the UE, and the UE transmits CQI report to a resource which is scheduled for uplink data transmission.

The PUCCH CQI channel structure for one slot in case of a normal CP will be understood with reference to FIG. 9. In this case, SC-FDMA symbols 1 and 5 (i.e., the second and sixth symbols) are used for DM RS (Demodulation Reference Signal) transmission. The PUCCH CQI channel structure for one slot in case of an extended CP will be understood with reference to FIG. 10. In this case, SC-FDMA symbol 3 is used for DM RS transmission. The DM-RS is a reference signal transmitted by the UE to the uplink and may be referred to as UL RS.

CQI information of 10 bits channel coded with a 1/2 coding rate is punctured by (20, k) Reed-Muller (RM) code to give 20 coded bits. Afterwards, the CQI information is scrambled (for example, scrambled in a similar way to PUSCH data with a length-31 Gold sequence) prior to QPSK constellation mapping. One QPSK modulated symbol is transmitted to each of the 10 SC-FDMA symbols in the subframe by modulating a cyclic time shift of the base RS sequence of length-12 prior to OFDM modulation. The 12 equally-spaced cyclic time shifts allow 12 different UEs to be orthogonally multiplexed on the same CQI PUCCH RB. The DM RS sequence is similar to the frequency domain CQI signal sequence but does not include CQI data modulation.

The UE is configured to periodically report different CQI, PMI, and RI types on CQI PUCCH by receiving a higher layer signal that includes a PUCCH resource index $n_{PUCCH}^{(2)}$, which indicates both the cyclic time shift and the PUCCH region which will be used.

2.2 HARQ ACK/NACK Transmission Through PUCCH Format 1

Figure 11:
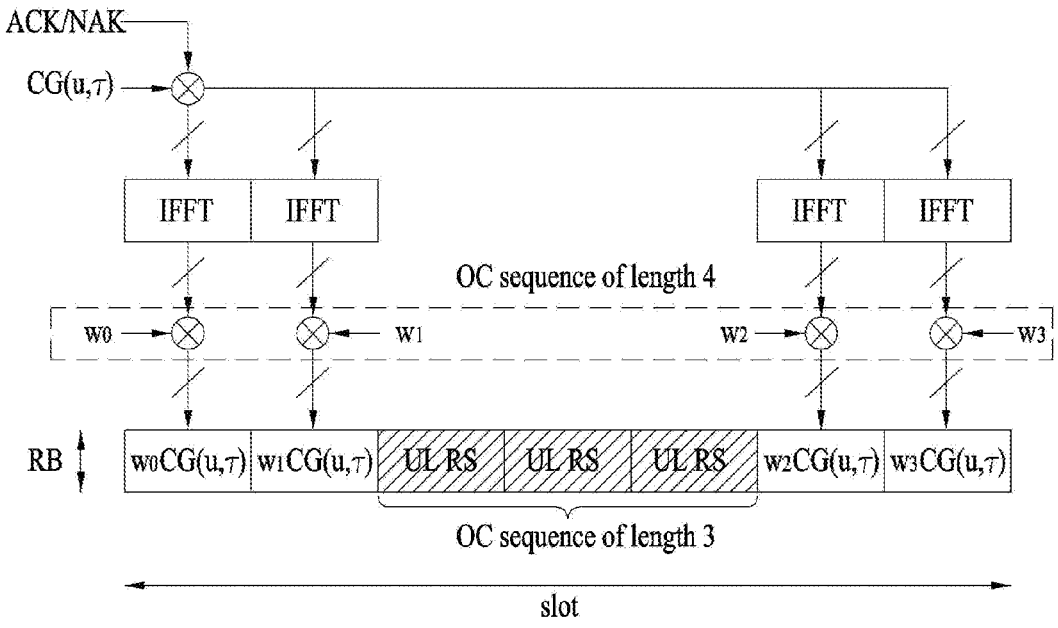
FIG. 11 is a diagram illustrating PUCCH formats 1a/1b in case of a normal cyclic prefix.
Figure 12:
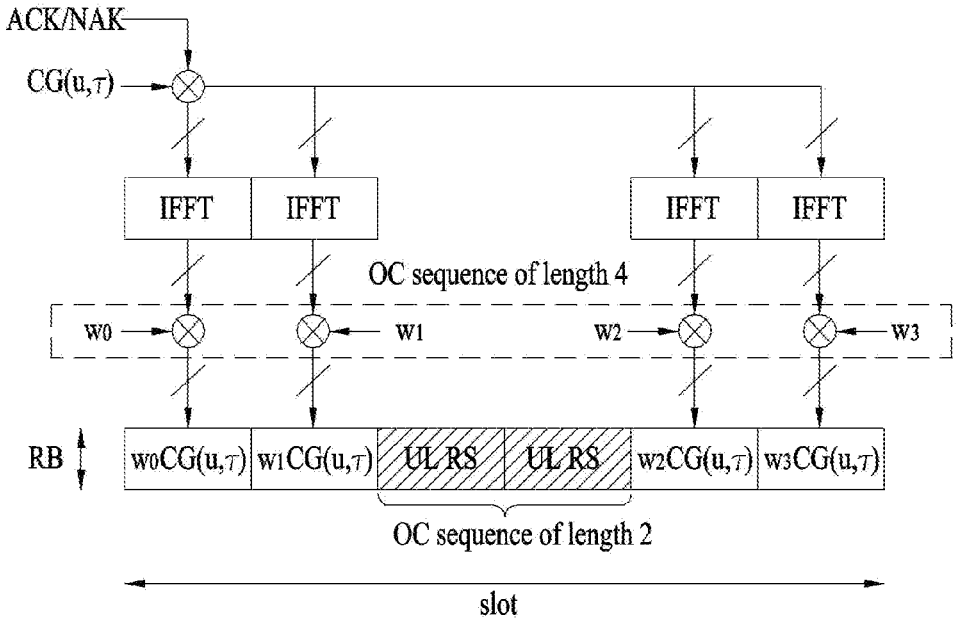
FIG. 12 is a diagram illustrating PUCCH formats 1a/1b in case of an extended cyclic prefix.

FIG. 11 is a diagram illustrating PUCCH formats 1a/1b in case of a normal cyclic prefix, and FIG. 12 is a diagram illustrating PUCCH formats 1a/1b in case of an extended cyclic prefix.

Referring to FIGS. 11 and 12, three SC-FDMA symbols in the middle of the slot are used for UL-RS in case of the normal CP, and two SC-FDMA symbols in the middle of the slot are used for UL-RS in case of the extended CP. At this time, both 1- and 2-bit ACK/NACKs are modulated using BPSK and QPSK modulation, respectively.

In case of CQI transmission, the one BPSK/QPSK modulated symbol is transmitted on each SC-FDMA data symbol by modulating a cyclic time shift of the base RS sequence of length-12 (i.e. frequency-domain CDM) prior to OFDM modulation. In addition, time-domain spread codes with orthogonal (Walsh-Hadamard of DFT) spreading codes are used to code-division-multiplex UEs. The RSs from the different UEs are multiplexed in the same way as the data SC-FDMA symbols.

2.3 Multiplexing of CQI and ACK/NACK

In the LTE system, simultaneous transmission of HARQ ACK/NACK and CQI is enabled by UE-specific higher layer signaling.

In the case that simultaneous transmission is not enabled and that the UE is configured to report CQI on the PUCCH of the same subframe that needs HARQ ACK/NACK transmission, CQI report is dropped and only HARQ ACK/NACK is transmitted using the PUCCH format 1a/1b.

In the case that simultaneous transmission is enabled, the CQI and the 1- or 2-bit ACK/NACK information need to be multiplexed on the same PUCCH RB while maintaining the low CM (Cubic Metric) single carrier property. The methods used to achieve this are different for the case of normal CP and extended CP.

Figure 13:
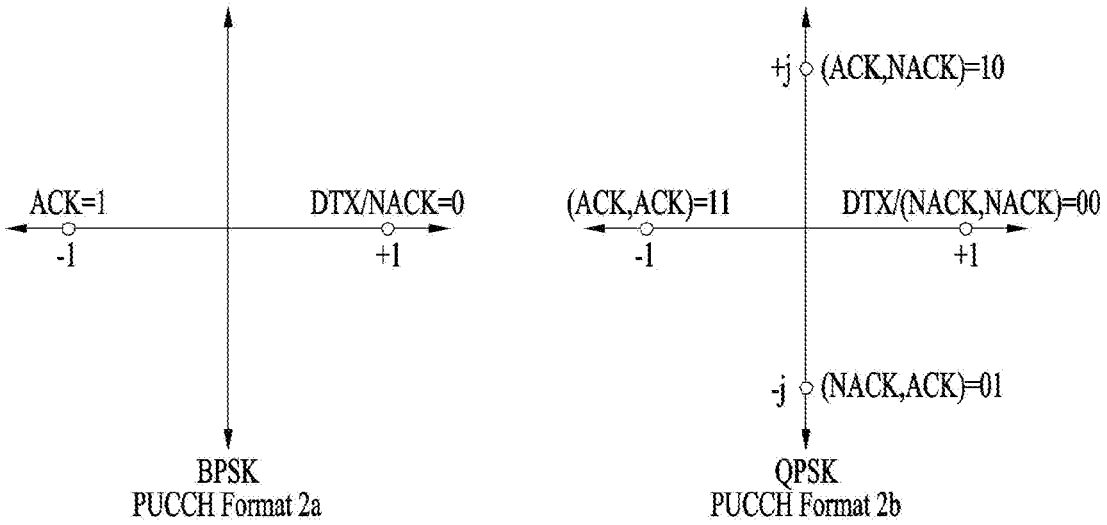
FIG. 13 is a diagram illustrating one of constellation mapping of HARQ ACK/NACK for a normal CP.

In the case of the normal CP, to transmit a 1- or 2-bit HARQ ACK/NACK together with CQI, the ACK/NACK bits (which are not scrambled) are BPSK/QPSK modulated as shown in FIG. 13, resulting in a single HARQ ACK/NACK modulation symbol $d_{HARQ}$. FIG. 13 is a diagram illustrating one of constellation mapping of HARQ ACK/NACK for a normal CP. At this time, an ACK signal is encoded as a binary '1' and a NACK signal is encoded as a binary '0'. The single HARQ ACK/NACK modulation symbol, $d_{HARQ}$, is then used to modulate the second RS symbol (SC-FDMA symbol 5, i.e., RS signaled by ACK/NACK) in each CQI slot. That is, ACK/NACK is signaled using the corresponding RS.

Figure 14:
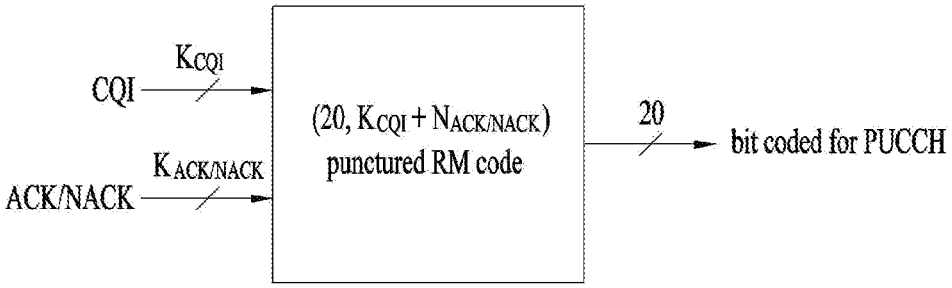
FIG. 14 is a diagram illustrating joint coding performed for HARQ ACK/NACK and CQI for an extended CP.

In case of the extended CP with one RS symbol per slot, the 1- or 2-bit HARQ ACK/NACK is jointly encoded with the CQI resulting in a (20, $k_{CQI}+k_{A/N}$) Reed-Muller based block code. A 20-bit codeword is transmitted on the PUCCH that uses the CQI channel structure of FIG. 9. The joint coding of the ACK/NACK and CQI is performed as shown in FIG. 14. The largest number of information bits supported by the block code is 13. At this time, $k_{CQI}$=11 CQI bits and $k_{A/N}$=2 bits.

2.4 Multiplexing of SR and ACK/NACK

Figure 15:
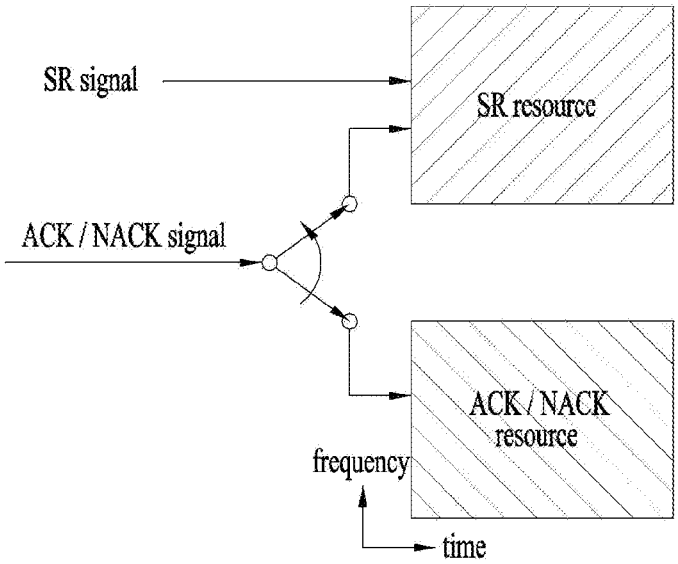
FIG. 15 is a diagram illustrating one of methods for multiplexing SR and ACK/NACK signal.
Figure 16:
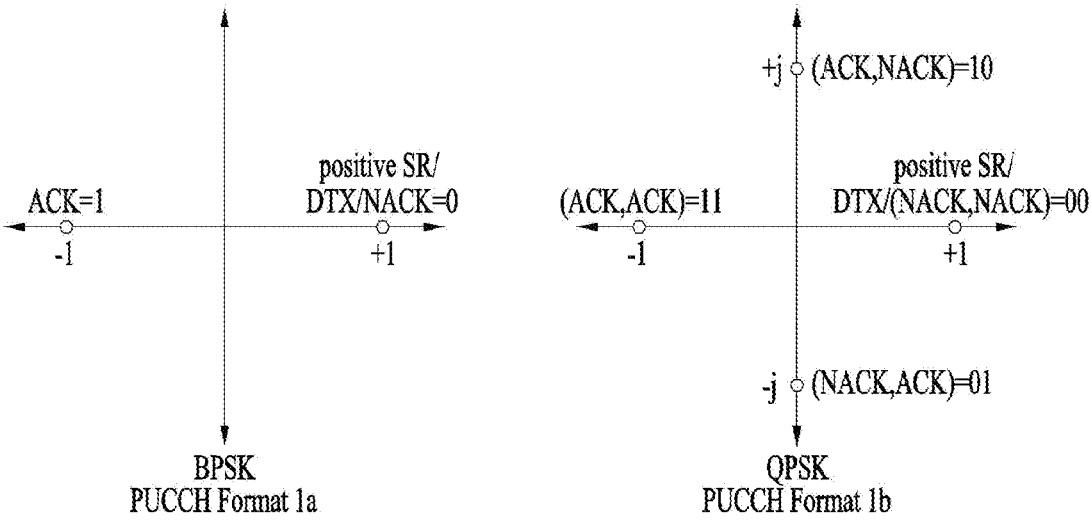
FIG. 16 is a diagram illustrating constellation mapping of ACK/NACK and SR for PUCCH formats 1/1a/1b.

FIG. 15 is a diagram illustrating one of methods for multiplexing SR and ACK/NACK signal, and FIG. 16 is a diagram illustrating constellation mapping of ACK/NACK and SR for PUCCH formats 1/1a/1b.

Referring to FIG. 15, if an SR signal and an ACK/NACK signal are simultaneously transmitted at the same subframe, the UE transmits the ACK/NACK signal on the SR PUCCH resource allocated for a positive SR or transmits ACK/NACK on the ACK/NACK PUCCH resource allocated in case of a negative SR. The constellation mapping for simultaneous transmission of ACK/NACK and SR is shown in FIG. 16.

2.5 HARQ ACK/NACK Transmission in TDD System

In case of LTE TDD (Time Division Multiplexing), since the UE can receive PDSCHs during a plurality of subframes, the UE can feed HARQ ACK/NACK for multiple PDSCHs back to the eNB. That is, there are two types of HARQ ACK/NACK transmission schemes as follows.

(1) ACK/NACK Bundling

With ACK/NACK bundling, ACK/NACK responses for multiple data units are combined by logical-AND operation. For example, if the Rx node (or receiver) decodes all the data units successfully, the Rx node transmits ACK using one ACK/NACK unit. Otherwise, if the Rx node fails in decoding any of the data units, the Rx node may either transmit NACK using one ACK/NACK unit or transmit nothing for ACK/NACK.

(2) ACK/NACK Multiplexing

With ACK/NACK multiplexing, contents of the ACK/NACK responses for multiple data units are identified by the combination of the ACK/NACK unit used in actual ACK/NACK transmission and the one of QPSK modulation symbols. For example, if it is assumed that one ACK/NACK unit carries two bits and two data units are transmitted in maximum, the ACK/NACK result can be identified at the TX node as illustrated in the following Table 9.

TABLE 9

| HARQ-ACK(0), HARQ-ACK(1) | $n_{PUCCH}^{(1)}$ | b(0), b(1) |
|---|---|---|
| ACK, ACK | $n_{PUCCH,1}^{(1)}$ | 1, 1 |
| ACK, NACK/DTX | $n_{PUCCH,0}^{(1)}$ | 0, 1 |
| NACK/DTX, ACK | $n_{PUCCH,1}^{(1)}$ | 0, 0 |
| NACK/DTX, NACK | $n_{PUCCH,1}^{(1)}$ | 1, 0 |
| NACK, DTX | $n_{PUCCH,0}^{(1)}$ | 1, 0 |
| DTX, DTX | N/A | N/A |

In Table 9, HARQ-ACK(i) indicates the ACK/NACK result for the data unit i (there are maximum 2 data units, that is, data unit 0 and data unit 1 in this example). In Table 9, DTX means there is no data unit transmitted for corresponding HARQ-ACK(i) or the Rx node does not detect the existence of the data unit corresponding to HARQ-ACK(i).

$n_{PUCCH,X}^{(1)}$ indicates the ACK/NACK unit which is used in actual ACK/NACK transmission, where there are two ACK/NACK units, $n_{PUCCH,0}^{(1)}$ and $n_{PUCCH,1}^{(1)}$ in maximum.

b(0),b(1) indicates two bits carried by the selected ACK/NACK unit. Modulation symbol which is transmitted through ACK/NACK unit is decided in accordance with the bits. For example, if the RX node receives and decodes two data units successfully, the Rx node transmits two bits, (1, 1), using ACK/NACK unit $n_{PUCCH,1}^{(1)}$. For another example, if the Rx node receives two data units, fails in decoding of the first data unit (corresponding to HARQ-ACK(0)), and decodes the second data unit (corresponding to HARQ-ACK(1)) successfully, the RX node transmits two bits (0, 0) using $n_{PUCCH,X}^{(1)}$.

By linking the actual ACK/NACK contents with the combination of ACK/NACK unit selection and the actual bit contents used for transmission of the ACK/NACK unit, ACK/NACK transmission using single ACK/NACK unit for multiple data units is possible. The example described in Table 9 can be extended to the ACK/NACK transmission for more than 2 data units.

In ACK/NACK multiplexing method, NACK and DTX are coupled as NACK/DTX as shown in Table 9 if at least one ACK exists for all data units. This is because that combinations of ACK/NACK unit and QPSK symbol are insufficient to cover all ACK/NACK hypotheses based on decoupling of NACK and DTX. On the other hand, for the case that no ACK exists for all data units (in other words, NACK or DTX only exists for all data units), single definite NACK case is defined as the case that only one of HARQ-ACK(i) is NACK decoupled with DTX. In this case, ACK/NACK unit linked to the data unit corresponding to single definite NACK can also be reserved to transmit the signal of multiple ACK/NACKs.

When the maximum number of data units which can be transmitted within a given amount of physical resources becomes larger, the required ACK/NACK hypotheses for ACK/NACK multiplexing over all the data units may exponentially increase. Denoting the maximum number of data units and the number of corresponding ACK/NACK units as N and $N_A$, respectively, $2^N$ ACK/NACK hypotheses are required for ACK/NACK multiplexing even if DTX case is precluded. On the other hand, applying the single ACK/NACK unit selection as described above, ACK/NACK multiplexing can be supported by up to 4N, ACK/NACK hypotheses.

In other words, as the number of data units increases, the single ACK/NACK unit selection requires relatively larger amount of ACK/NACK units which yields increased overhead of control channel resources required to transmit the signal for multiple ACK/NACKs. For example, if 5 data units (N=5) are used for transmission, 8 ACK/NACK units ($N_A$=8) should be available for ACK/NACK transmission because the required number of ACK/NACK hypotheses for ACK/NACK multiplexing is $2^N$=32 (=$4N_A$).

2.6 Uplink Channel Coding for PUCCH Format 2

In LTE uplink transmission, certain control channels are encoded using a linear block code as illustrated in Table 10.

TABLE 10

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 0 | 1 | 0 | 1 | 1 | 1 | 1 | 1 |
| 3 | 1 | 0 | 1 | 1 | 0 | 0 | 0 | 0 | 1 | 0 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 1 | 0 | 1 | 1 | 1 | 1 |
| 9 | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 |

If input bits to the linear block code is denoted as $a_0$, $a_1$, $a_2$, . . . , $a_A$, after encoding the bits are denoted by $b_0$, $b_1$, $b_2$, . . . , $b_B$ where B=20. The following Equation 3 indicates one of methods for generating encoded bits.

$$b_i = \left(\sum_{n=0}^{A-1} (a_n \cdot M_{i,n})\right) \bmod 2, \quad \text{where } i = 0, 1, 2, \ldots, B-1. \qquad \text{[Equation 3]}$$

Figure 17:
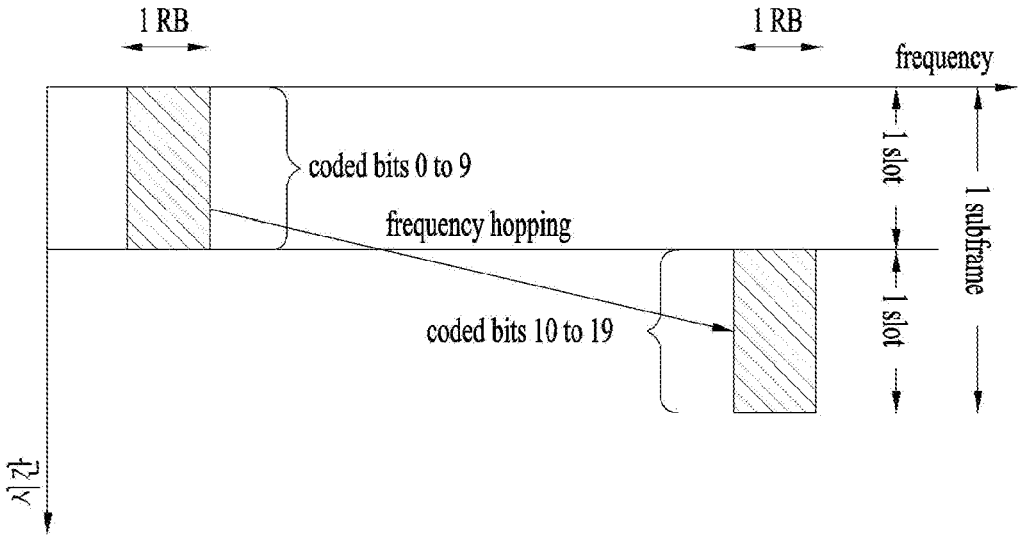
FIG. 17 is a diagram illustrating methods of matching control information with a physical resource region.

The encoded bits then are mapped to code-time-frequency resource as shown in FIG. 17. FIG. 17 is a diagram illustrating methods of matching control information with a physical resource region. The first 10 encoded bits are mapped a specific code-time-frequency resource, and the last 10 encoded bits are mapped to a different code-time-frequency resource. At this time, the frequency spacing between first 10 encoded bits and the last 10 encoded bits are usually large, whereby frequency diversity for the encoded bits can be obtained.

2.7 Uplink Channel Coding in LTE-A System

As described above, in the LTE system (that is, Rel-8), if UCI is transmitted to a PUCCH format 2, (20, A) RM coding of Table 10 is performed for CSI of maximum 13 bits. However, if the UCI is transmitted to the PUSCH, (32, A) RM coding of Table 11 is performed for CQI of maximum 11 bits, and truncation or cyclic repetition is performed to match a code rate which will be transmitted to the PUSCH.

TABLE 11

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 1 | 0 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0 |

In the LTE-A system, a PUCCH format 3 has been introduced to transmit UCI (A/N and SR) bits of maximum 21 bits, and in the status of the normal CP, the UE may transmit code bits of 48 bits by using the PUCCH format 3. Therefore, when the number of UCI bits is 11 bits or less, (32, A) RM coding is used, and in this case, cyclic repetition of code bits is used to correspond to code bits required by the PUCCH format 3. If the number of UCI bits exceeds 11 bits, the number of (32, A) RM code based sequences in Table 11 is not sufficient, whereby two code bits are generated using two (32, A) RM coding blocks as illustrated in FIG. 18 (this case will be referred to as Dual RM), and the other bits are transmitted by truncation and interleaving to reduce the two code bits to correspond to the number of code bits of the PUCCH format 3.

In the case that the UCI of maximum 21 bits is transmitted to the PUSCH, truncation or cyclic repetition is performed using (32, A) RM coding in the same manner as the legacy Rel-8 system to match a code rate which will be transmitted to the PUSCH when the number of UCI bits is 11 bits or less, whereas two coded bits are generated using Dual RM when the number of UCI bits exceeds 11 bits, and truncation or cyclic repetition is performed for the two coded bits to match the code rate which will be transmitted to the PUSCH.

Figure 18:
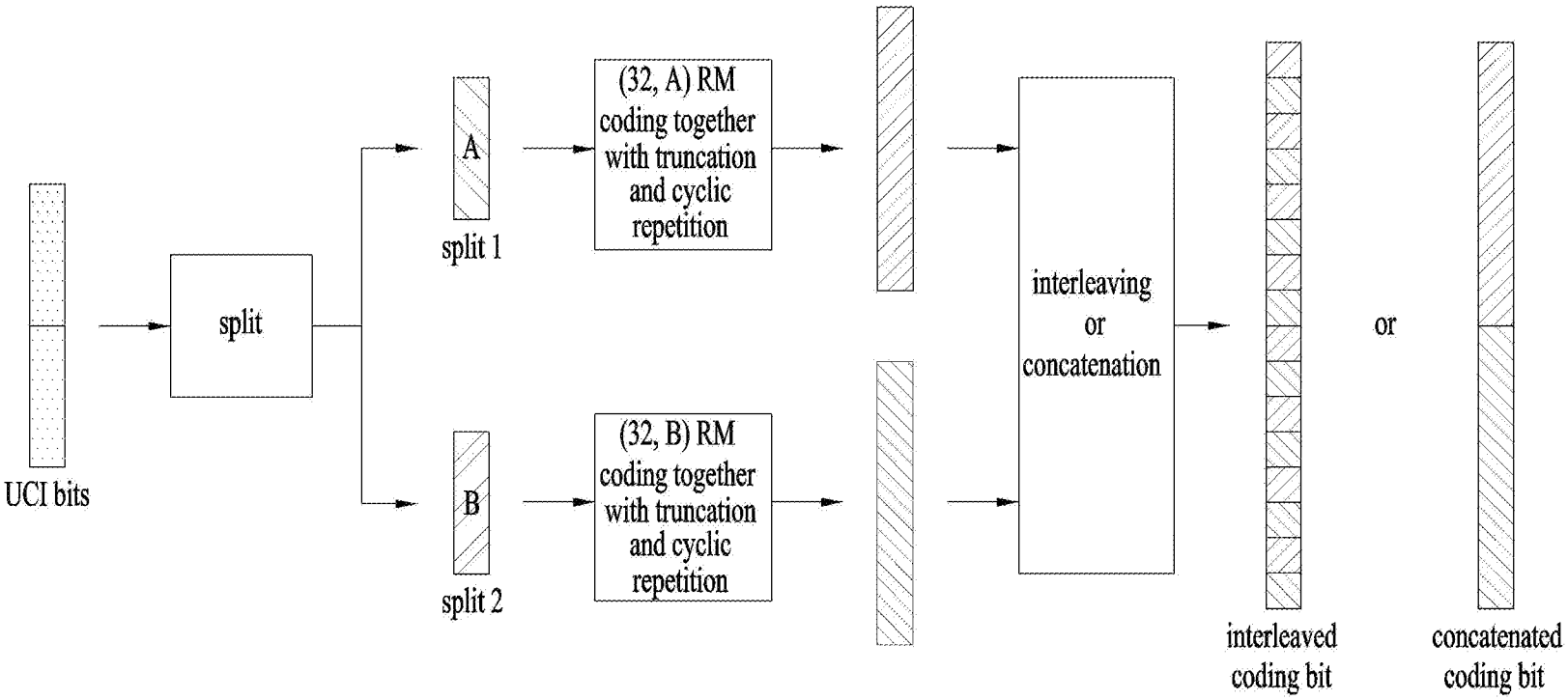
FIG. 18 is a diagram illustrating an example of a coding method based on a dual RM scheme.

Referring to FIG. 18, when the number of input UCI bits corresponds to 21 bits, the transmitter generates a part 1 and a part 2 by dividing the corresponding UCI bits. Afterwards, the transmitter applies (32, A) RM coding to each of the part 1 and the part 2, and truncates or cyclically repeats the code bits to match with 48 bits that can be transmitted by the PUCCH format 3. Then, the transmitter interleaves or concatenates code bits which are output, whereby the code bits can be transmitted through the PUCCH format 3.

In more detail, a bit configuration order per UCI will be described. If the PUCCH format 3 is configured to be used for an SR transport subframe, when SR and A/N are transmitted to the PUCCH format 3 or the PUSCH, the A/N is first arranged and then the SR is arranged next to the A/N, whereby UCI bits are configured.

Figure 19:
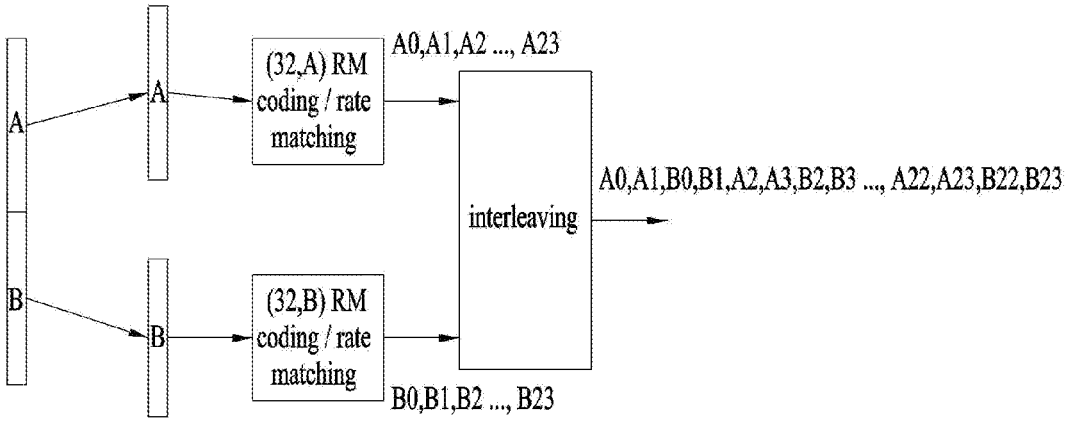
FIG. 19 is a diagram illustrating a method for interleaving output code bits when dual RM described in FIG. 18 is used.

FIG. 19 is a diagram illustrating a method for interleaving output code bits when dual RM described in FIG. 18 is used. Referring to FIG. 19, when data blocks (that is, UCI) of lengths A and B are respectively input to (32, A) and (32, B) RM encoders, the output code bits are subjected to rate matching of 24 bits to become A0, A1 , . . . , A23 and B0, B1, . . . , B23.

The code bits A0, A1, . . . , A23 and B0, B1 , . . . , B23 are input to an interleaver, and the code bits output from the interleaver are output in pairs in due order to generate bit streams of A0, A1, B0, B1, A2, A3, B2, B3, . . . , A22, A23, B22 and B23. The bit streams are QPSK modulated and transmitted in accordance with a PUCCH format 3 transport format, wherein the first 24 bits (12 QPSK symbols) of the bit streams are mapped into a first slot and the other 24 bits (12 QPSK symbols) are mapped into a second slot.

3. Polar Coding

A polar code is known as a channel code that can obtain channel capacity in a B-DMC (Binary-input Discrete Memory less Channel). That is, the polar code is a channel code that can obtain channel capacity having no error when a size N of a code block becomes large infinitely. An encoder of the polar code can perform a channel combining procedure and a channel splitting procedure.

Figure 20:
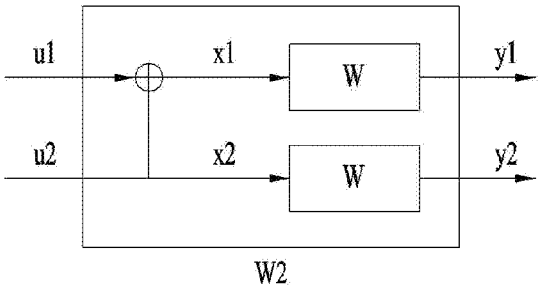
FIG. 20 is a diagram illustrating a first level channel combining procedure performed by polar coding.

The channel combining procedure is to concatenate B-DMCs in parallel and determine the size of the code block. FIG. 20 is a diagram illustrating a first level channel combining procedure performed by polar coding. That is, FIG. 20 illustrates that two W which are B-DMCs are combined with each other.

In this case, $u_1$ and $u_2$ are binary-input source bits, and $y_1$ and $y_2$ are output coded bits. At this time, it is assumed that an entire equivalent channel is $W_2$. When N number of B-DMCs are subjected to channel combining, the respective channels which are combined can be expressed in a recursive format. That is, when $x_1^N = u_1^N G_N$, $x_1^N = \{x_1, \ldots, x_N\}$, and $u_1^N = \{u_1, \ldots, u_N\}$, a generator matrix $G_N$ can be calculated as expressed by the following Equation 4.

$$G_N = B_N F^{\otimes n},\ N = 2^n,\ F = \begin{bmatrix} 1 & 0 \\ 1 & 1 \end{bmatrix}, \quad \text{[Equation 4]}$$

$$F^{\otimes n} = F \otimes F^{\otimes(n-1)},\ F^{\otimes 0} = 1,\ B_N = R_N\left(I_2 \otimes B_{\frac{N}{2}}\right)$$

Figure 21:
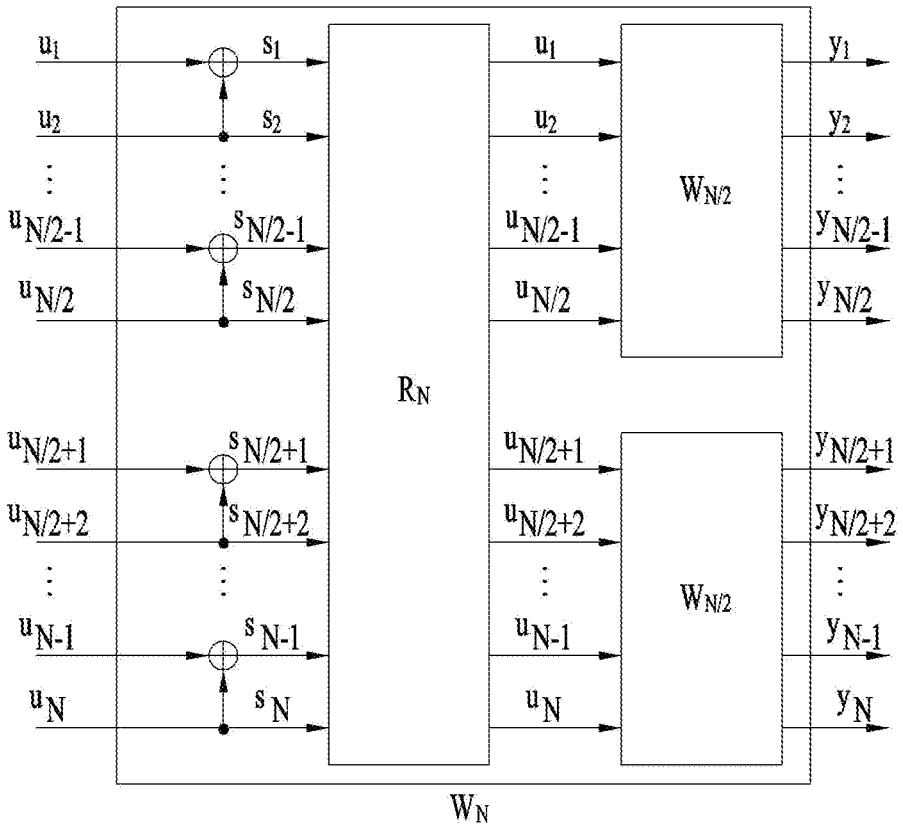
FIG. 21 is a diagram illustrating an Nth level channel combining procedure performed by polar coding, wherein a size N of a code block has a limit of 2N (n is a natural number).

In the Equation 4, $R_N$ indicates a bit-reversal interleaver, and performs a mapping operation for an input bit $s_1^N$ into an output bit $x_1^N = (s_1, s_3, \ldots, s_{N-1}, s_2, \ldots, s_N$. This relation is shown in FIG. 21. FIG. 21 is a diagram illustrating an Nth level channel combining procedure performed by polar coding, wherein a size N of a code block has a limit of $2^n$ (n is a natural number).

After N number of B-DMCs are subjected to channel combining, a procedure of defining an equivalent channel for a specific input can be defined as a channel splitting procedure. The channel splitting procedure can be expressed as channel transition probability as expressed by the following Equation 5.

$$W_N^{(i)}(y_1^N, u_1^{i-1} \mid u_i) = \sum_{u_{i+1}^N} \frac{1}{2^{N-1}} W_N(y_1^N \mid u_1^N) \quad \text{[Equation 5]}$$

After the aforementioned channel combining procedure and the aforementioned channel splitting procedure are performed, a theory as disclosed in Table 12 below can be derived.

TABLE 12

| |
|---|
| Theorem: For any B-DMC W, the channels $\{W_N^{(i)}\}$ polarize in the sense that, for any fixed $\delta \in (0, 1)$, as N goes to infinity through powers of two, the fraction of indices $i \in \{1, \ldots, N\}$ for which $I(W_N^{(i)}) \in (1 - \delta, 1]$ goes to I(W) and the fraction for which $I(W_N^{(i)}) \in [0, \delta)$ goes to $1 - I(W)$. Hence, as $N \to \infty$, channels polarize, either completely noisy or noise free and we know these channels exactly at the transmitter. So, we fix bad channels and transmit uncoded bits over good ones. |

The theory derived in Table 12 is as follows. If the size N of the code block becomes great infinitely, the equivalent channel for the specific input bit is categorized into a noise channel having an error and a noise free channel having no error. This means that capacity of the equivalent channel for the specific input bit is categorized into 0 or I (W).

One of methods for decoding a polar code is a successive cancellation (SC) decoding method. The SC decoding method is to obtain a channel transition probability and calculate a likelihood ratio (LLR) for the input bit based on the channel transition probability. At this time, the channel transition probability can be calculated in a recursive format using a recursive property of the channel combining procedure and the channel splitting procedure.

Therefore, LLR value can finally be calculated in a recursive format. First of all, $W_N^{(i)}(y_1^N, u_1^{i-1} \mid u_i)$ which is a channel transition probability for the input bit $u_i$ can be obtained through the following Equations 6 and 7. In this case, $u_1^i$ can be defined as $u_{1,o}^i$, $u_{1,e}^i$ by being split into an odd index and an even index.

$$\begin{aligned} W_{2N}^{(2i-1)}(y_1^{2N}, u_1^{2i-2} \mid u_{2i-1}) &= \sum_{u_{2i}^{2N}} \frac{1}{2^{2N-1}} W_{2N}(y_1^{2N} \mid u_1^{2N}) = \\ &\sum_{u_{2i,o}^{2N}, u_{2i,e}^{2N}} \frac{1}{2^{2N-1}} W_N(y_1^N \mid u_{1,o}^{2N} \oplus u_{1,e}^{2N}) W_N(y_{N+1}^{2N} \mid u_{1,e}^{2N}) = \\ &\sum_{u_{2i}} \frac{1}{2} \sum_{u_{2i+1,e}^{2N}} \frac{1}{2^{N-1}} W_N(y_{N+1}^{2N} \mid u_{1,e}^{2N}) \cdot \\ &\sum_{u_{2i+1,o}^{2N}} \frac{1}{2^{N-1}} W_N(y_1^N \mid u_{1,o}^{2N} \oplus u_{1,e}^{2N}) = \\ &\sum_{u_{2i}} \frac{1}{2} W_N^{(i)}(y_1^N, u_{1,o}^{2i-2} \oplus u_{1,e}^{2i-2} \mid u_{2i-1} \oplus u_{2i}) \cdot \\ &W_N^{(i)}(y_{N+1}^{2N}, u_{1,e}^{2i-2} \mid u_{2i}) \end{aligned} \quad \text{[Equation 6]}$$

using the definition of $$W_N^{(i)}(y_1^N, u_1^{i-1} \mid u_i) = \sum_{u_{i+1}^N} \frac{1}{2^{N-1}} W_N(y_1^N \mid u_1^N)$$

$$\begin{aligned} W_{2N}^{(2i)}(y_1^{2N}, u_1^{2i-2} \mid u_{2i}) &= \sum_{u_{2i+1}^{2N}} \frac{1}{2^{2N-1}} W_{2N}(y_1^{2N} \mid u_1^{2N}) = \\ &\sum_{u_{2i+1,o}^{2N}, u_{2i+1,e}^{2N}} \frac{1}{2^{2N-1}} W_N(y_1^N \mid u_{1,o}^{2N} \oplus u_{1,e}^{2N}) W_N(y_{N+1}^{2N} \mid u_{1,e}^{2N}) = \\ &\frac{1}{2} \sum_{u_{2i+1,e}^{2N}} \frac{1}{2^{N-1}} W_N(y_{N+1}^{2N} \mid u_{1,e}^{2N}) \cdot \\ &\sum_{u_{2i+1,o}^{2N}} \frac{1}{2^{N-1}} W_N(y_1^N \mid u_{1,o}^{2N} \oplus u_{1,e}^{2N}) = \\ &\frac{1}{2} W_N^{(i)}(y_1^N, u_{1,o}^{2i-2} \oplus u_{1,e}^{2i-2} \mid u_{2i-1} \oplus u_{2i}) \cdot \\ &W_N^{(i)}(y_{N+1}^{2N}, u_{1,e}^{2i-2} \mid u_{2i}) \end{aligned} \quad \text{[Equation 7]}$$

At this time, $$L_N^{(2i-1)}(y_1^N, \hat{u}_1^{2i-2}) = \frac{L_{N/2}^{(i)}(y_1^{N/2}, \hat{u}_{1,o}^{2i-2} \oplus \hat{u}_{1,e}^{2i-2}) L_{N/2}^{(i)}\left(y_{\frac{N}{2}+1}^N, \hat{u}_{1,e}^{2i-2}\right) + 1}{L_{N/2}^{(i)}(y_1^{N/2}, \hat{u}_{1,o}^{2i-2} \oplus \hat{u}_{1,e}^{2i-2}) + L_{N/2}^{(i)}\left(y_{\frac{N}{2}+1}^N, \hat{u}_{1,e}^{2i-2}\right)}, \quad \text{[Equation 8]}$$

$$L_N^{(2i)}(y_1^N, \hat{u}_1^{2i-1}) = [L_{N/2}^{(i)}(y_1^{N/2}, \hat{u}_{1,o}^{2i-2} \oplus \hat{u}_{1,e}^{2i-2})]^{1-2\hat{u}_{2i-1}} \cdot L_{N/2}^{(i)}\left(y_{\frac{N}{2}+1}^N, \hat{u}_{1,e}^{2i-2}\right)$$

which is LLR for the input bit can be obtained as expressed by the following Equation 8.

$$L_N^{(i)} = \frac{W_N^{(i)}(y_1^N, \hat{u}_1^{i-1} \mid 0)}{W_N^{(i)}(y_1^N, \hat{u}_1^{i-1} \mid 1)}$$

Since arithmetic symbols used in all the Equations described in the embodiments of the present invention are used to refer to the same meaning as general arithmetic symbols, their detailed description will be omitted, and may be interpreted as the same definition as general arithmetic symbols when the corresponding Equations are interpreted.

The polar encoder and the SC decoder have complexity of O (N log N), which is varied depending on the length N of the code block. When an input bit of K bits is assumed in the polar code of the length N, a coding rate is K/N. At this time, if a generator matrix of the polar encoder of a data payload size N is defined as $G_N$, encoding bits can be expressed as $x_1^N=u_1^N G_N$, and K number of bits of $u_1^N$ correspond to payload bits. It is assumed that a row index of $G_N$ corresponding to the payload bits is I and a row index of $G_N$ corresponding to the other N-K bits is F. A minimum distance of the aforementioned polar code is defined as expressed by the following Equation 9.

$$d_{min}(C) = \min_{i \in I} 2^{wt(i)} \quad \text{[Equation 9]}$$

In the Equation 9, wt(i) means the number of '1' during binary extension of i(i=0, 1, . . . , N−1). That is, wt(i) means the number of '1' when an index (that is, column index I of $G_N$) of a channel is expressed as a binary.

3.1 Derivation of Equivalent Channel

The embodiments of the present invention suggest methods for applying polar coding to a mobile communication system.

As described above, if the channel combining procedure and the channel splitting procedure are performed, the equivalent channel is categorized into a noise channel and a noise free channel. At this time, a data payload should be transmitted to the noise free channel. That is, the data payload should be transmitted to the noise free equivalent channel to obtain good performance.

At this time, a method for discovering the noise free equivalent channel can be determined by obtaining a value $z(W)=\Sigma\sqrt{W(y|0)W(y|1)}$ of the equivalent channel for each input bit. In this case, Z(W) is referred to as a Bhattacharyya parameter. Z(W) means a value corresponding to an upper-bound of an error probability when MAP decision is performed after a binary input 0 or 1 is transmitted. Therefore, values of Z(W) are obtained and then arranged in an ascending order (small order) to select the value of Z(W) as much as a desired data payload, whereby the corresponding data can be transmitted through the noise free channel Z(W) can be obtained for a BEC (Binary Erasure Channel) as expressed by the following Equation 10.

$$Z(W_N^{(i)}) = Z(W_{(b_1,b_2,\ldots,b_{k-1})}) = \begin{cases} 2Z(W_{(b_1,b_2,\ldots,b_{k-1})}) - Z(W_{(b_1,b_2,\ldots,b_{k-1})})^2, & \text{if } b_k = 0 \\ Z(W_{(b_1,b_2,\ldots,b_{k-1})})^2, & \text{if } b_k = 1 \end{cases} \quad \text{[Equation 10]}$$

When the size of the code block is 8 in case of the BEC having an erasure probability of 0.5, the value of Z(W) is calculated as follows using the Equation 10. Z(W)={1.00, 0.68, 0.81, 0.12, 0.88, 0.19, 0.32, 0.00}. Therefore, when the size of the data payload is 2, the data payload is transmitted through an equivalent channel 8 (Z(W)=0.00) and an equivalent channel 4 (Z(W)=0.12).

3.1.1 CRC Addition Method

The transmitter of the wireless access system transmits data by adding CRC (Cyclic Redundancy Check) bits to a data payload to detect an error of the data. That is, in the following embodiments, the data payload may be used to include one or more data bits and CRC bits unless described separately. Since CRC can detect an error, if performance of error detection through CRC is relatively stable, performance of error detection of the data block can be improved. To this end, when values of Z(W) which are obtained are listed in an ascending order (small order), CRC bit streams are arranged in equivalent channels corresponding to a CRC length and then data bits are arranged, whereby error detection performance can be improved.

For example, it is assumed that 3-bit data and 2-bit CRC input in a data payload are subjected to polar coding using a polar encoder of a length 8 as expressed in the Equation 10. At this time, after CRC 2 bits are arranged in an equivalent channel 8 (that is, channel of Z(W)=0.00) and an equivalent channel 4 (that is, channel of Z(W)=0.12) which are noise free channels having the best performance, the data payload can be transmitted through an equivalent channel 6 (that is, channel of Z(W)=0.19, an equivalent channel 7 (that is, channel of Z(W)=0.32) and an equivalent channel 2 (that is, channel of Z(W)=0.68) which are noise free channels having good performance next to the best performance.

The method for calculating the value of Z(W) as expressed in the Equation 10 is performed in the BEC. Therefore, an equivalent channel which will transmit the data payload can be discovered in an additive white Gaussian nose (AWGN) channel by another method. However, even in this case, CRC allows the values of Z(W) which are obtained to be arranged in an ascending order (small order), whereby the equivalent channels are allocated to CRC bits as much as the CRC length, and then the data payload can be arranged in the other equivalent channels.

Also, as still another method, in the case that the receiver does not assume SC decoding, reliability of the CRC bits and reliability of the data payload are important equally. Therefore, when the values of Z(W) are arranged in an ascending order (small order), the data payload is allocated to the equivalent channel having good performance and then the CRC bits can be allocated to next equivalent channels.

It is preferable that the transmitter and the receiver know the equivalent channel, which will be allocated to the data payload, in accordance with the size of the data payload including CRC bits, and a coding rate. It is also preferable that the equivalent channel which will be allocated to the data payload is previously calculated by the transmitter.

Therefore, if the transmitter transmits information on the data payload size and the coding rate to the receiver, the receiver can perform decoding for a polar coded data signal by acquiring information on the equivalent channel to which the data payload is transmitted.

Also, the code block size of the polar encoder of which coding rate is r=K/N is N and its payload size is K. In this case, a bit stream corresponding to N-K is a bit stream allocated and transmitted to the noise channel. It is preferable that the bit stream is previously determined by the transmitter and the receiver. The bit stream which will be allocated to the noise channel can be determined as {0, 0, . . . , 0} or {1, 1, . . . , 1} corresponding to its size N-K.

3.2 Rate Matching for Encoding Bits

The polar encoder has a size of a code block, which is limited to $2^n$ (n is a natural number) in view of its property. Therefore, a rate matching operation of puncturing (or truncation) or repetition is required depending on transmission numerology of the system. Hereinafter, the rate matching procedure for coded bits will be described.

In the embodiments of the present invention, it is assumed that a size of a data payload (including CRC) generated by a higher layer satisfies a relation of $2^n<N<2^{n+1}$. At this time, if a first threshold value THR1 of a codeword size exists and thus a size of a code bit is greater than the first threshold value, the transmitter performs encoding through a mother polar encoder of $2^{n+1}$ size and then performs puncturing as much as $2^{n+1}-N$ bits, whereby encoding bit streams of a codeword size N are generated. At this time, the mother polar encoder means an encoder which is a reference for performing repetition or puncturing in accordance with a size of the data payload.

Meanwhile, if the size of the data payload is smaller than a second threshold value THR2, the transmitter performs encoding through a mother polar encoder of $2^n$ size and then generates encoding bit streams corresponding to the code block size N through repetition as much as $N-2^n$ bits. At this time, it is preferable that the size of the data payload satisfies a relation of $K<2^n$. In this case, THR1 and THR2 may be the same as each other or may be different from each other.

Hereinafter, methods for configuring a generator matrix for performing rate matching by puncturing or repeating codeword bits considering a weight value, a minimum distance and/or a priority will be described.

3.2.1 Configuration of Generator Matrix Using Weight Value

If a generator matrix of a polar encoder of a size N for an input data payload is $G_N$, encoded bit streams can be expressed as $x_1^N=u_1^N G_N$. At this time, a number of "1" in each column of $G_N$ can be defined as a weight value of each column. If repetition is performed for $G_N$ by the mother polar encoder, repetition is performed in the order of column having a greater weight value, whereby a distance of repeated codewords can be set to a maximum value.

Likewise, if the transmitter performs puncturing for $G_N$ by the mother polar encoder, repetition is performed in the order of column having a smaller weight value, whereby a distance of punctured codewords can be set to a maximum value. In the embodiments of the present invention, the mother polar encoder can be used as the same meaning as a mother generator matrix. Also, the mother generator matrix can be defined as a first generator matrix, and a new generator matrix generated from the mother generator matrix by repetition or puncturing can be defined as a second generator matrix.

The following Equation 11 is an example of a generator matrix $G_N$ of a polar encoder of which code block size is N=8.

$$G_8 = \begin{bmatrix} 1 & 0 & 0 & 0 & 0 & 0 & 0 & 0 \\ 1 & 0 & 0 & 0 & 1 & 0 & 0 & 0 \\ 1 & 0 & 1 & 0 & 0 & 0 & 0 & 0 \\ 1 & 0 & 1 & 0 & 1 & 0 & 1 & 0 \\ 1 & 1 & 0 & 0 & 0 & 0 & 0 & 0 \\ 1 & 1 & 0 & 0 & 1 & 1 & 0 & 0 \\ 1 & 1 & 1 & 1 & 0 & 0 & 0 & 0 \\ 1 & 1 & 1 & 1 & 1 & 1 & 1 & 1 \end{bmatrix} \quad \text{[Equation 11]}$$

The weight value of each column in the polar encoder having the generator matrix as expressed in the Equation 11 is {8, 4, 4, 2, 4, 2, 2, 1}. Therefore, when a codeword of a codeword length C=10 is transmitted, among respective columns of the generator matrix, the first column having the greatest weight value and one of second, third and fifth columns having great weight values next to the greatest weight value are selected and then transmitted repeatedly. That is, codeword C=8 is encoded using the generator matrix, and the other two codewords can be transmitted by selecting the first column and one of the second, third and fifth columns and repeatedly encoding the selected columns. For example, when the transmitter selects the first column and the second column, a new generator matrix is $G'_8=[G_8\ G_r]$, $G_r=[G_8(:,1)\ G_8(:,2)]$. In this case, $G_8(:,x)$ is a column vector indicating the xth column.

Likewise, when a codeword of a codeword length C=6 is transmitted, the eighth column having the smallest weight value and one of fourth, sixth and seventh columns can be punctured and encoded. At this time, when the transmitter selects the eighth column and the fourth column, the generator matrix $G_6$ is as expressed by the following Equation 12.

$$G_6 = \begin{bmatrix} 1 & 0 & 0 & 0 & 0 & 0 \\ 1 & 0 & 0 & 1 & 0 & 0 \\ 1 & 0 & 1 & 0 & 0 & 0 \\ 1 & 0 & 1 & 1 & 0 & 1 \\ 1 & 1 & 0 & 0 & 0 & 0 \\ 1 & 1 & 0 & 1 & 1 & 0 \\ 1 & 1 & 1 & 0 & 0 & 0 \\ 1 & 1 & 1 & 1 & 1 & 1 \end{bmatrix} \quad \text{[Equation 12]}$$

The Equation 12 indicates a new generator matrix (that is, the second generator matrix) generated as the eighth column and the fourth column are punctured in the Equation 11.

If column permutation is performed for the columns of the generator matrix of the polar encoder in the order of greater weight values or smaller weight values, puncturing and repetition can easily be implemented. That is, when the columns of the first generator matrix are rearranged in the order of column having the greater weight value, repetition is performed in the order of column index, and if puncturing is performed in the reverse order of column index, the minimum distance of the codeword described in the Equation 9 can be set to a maximum value.

The following Equation 13 represents that permutation is performed for the generator matrix of the Equation 11 in the order of column weight value.

$$G_8 = \begin{bmatrix} 1 & 0 & 0 & 0 & 0 & 0 & 0 & 0 \\ 1 & 0 & 0 & 1 & 0 & 0 & 0 & 0 \\ 1 & 0 & 1 & 0 & 0 & 0 & 0 & 0 \\ 1 & 0 & 1 & 1 & 0 & 0 & 1 & 0 \\ 1 & 1 & 0 & 0 & 0 & 0 & 0 & 0 \\ 1 & 1 & 0 & 1 & 0 & 1 & 0 & 0 \\ 1 & 1 & 1 & 0 & 1 & 0 & 0 & 0 \\ 1 & 1 & 1 & 1 & 1 & 1 & 1 & 1 \end{bmatrix} \quad \text{[Equation 13]}$$

3.2.2 Configuration of Generator Matrix Based on Minimum Distance

Hereinafter, methods for configuring a generator matrix considering a minimum distance of a polar encoder will be described. In the generator matrix as expressed in the Equation 11, if the size of the payload is 2, the payload is transmitted through an equivalent channel corresponding to the eighth row and the fourth row (row 8, row 4) of the Equation 11. That is, a matrix such as $$\begin{bmatrix} 1 & 0 & 1 & 0 & 1 & 0 & 1 & 0 \\ 1 & 1 & 1 & 1 & 1 & 1 & 1 & 1 \end{bmatrix}$$

may be a generator sub-matrix corresponding to the 2-bit payload.

If output codewords of 6 bits are generated, the transmitter should puncture the column corresponding to 2 bits of the polar encoder from the mother generator matrix which is the first generator matrix. At this time, if puncturing is performed for the column having a small weight value, it is preferable that the column corresponding to 0 of the first row is punctured. If the second and fourth columns are punctured, the second generator matrix that generates a payload of 6 bits can be configured as expressed by the following Equation 14.

[Equation 14]

$$G_6 = \begin{bmatrix} 1 & 0 & 0 & 0 & 0 & 0 \\ 1 & 0 & 1 & 0 & 0 & 0 \\ 1 & 1 & 0 & 0 & 0 & 0 \\ 1 & 1 & 1 & 0 & 1 & 0 \\ 1 & 0 & 0 & 0 & 0 & 0 \\ 1 & 0 & 1 & 1 & 0 & 0 \\ 1 & 1 & 0 & 0 & 0 & 0 \\ 1 & 1 & 1 & 1 & 1 & 1 \end{bmatrix}$$

That is, column puncturing is performed in the order of smaller column weight values of a sub-matrix comprised of rows of a generator matrix corresponding to a payload.

3.2.3 Configuration of Generator Matrix Based on Priority

In another aspect of the present invention, a new generator matrix can be configured based on a priority of a column index of a mother generator matrix.

If the same column weight value is applied to columns of the mother generator matrix, puncturing may be performed in such a manner that a priority is given in the order of smaller column index or in the order of greater column index.

If puncturing is performed in the order of greater column index, the sixth column and the eighth column of the Equation 11 are punctured, whereby a generator matrix is obtained as expressed by the following Equation 15.

[Equation 15]

$$G_6 = \begin{bmatrix} 1 & 0 & 0 & 0 & 0 & 0 \\ 1 & 0 & 0 & 0 & 1 & 0 \\ 1 & 0 & 1 & 0 & 0 & 0 \\ 1 & 0 & 1 & 0 & 1 & 1 \\ 1 & 1 & 0 & 0 & 0 & 0 \\ 1 & 1 & 0 & 0 & 1 & 0 \\ 1 & 1 & 1 & 1 & 0 & 0 \\ 1 & 1 & 1 & 1 & 1 & 1 \end{bmatrix}$$

As described above, if puncturing and repetition are performed, performance of a newly generated generator matrix may be degraded due to the same column or row comprised of same elements. Therefore, puncturing or repetition is performed for the column corresponding to a priority, whereby the generator matrix can be configured.

3.3 Method for Transmitting and Receiving Data Using Polar Coding

Hereinafter, a method for transmitting data using polar coding will be described based on the aforementioned embodiments of the present invention.

Figure 22:
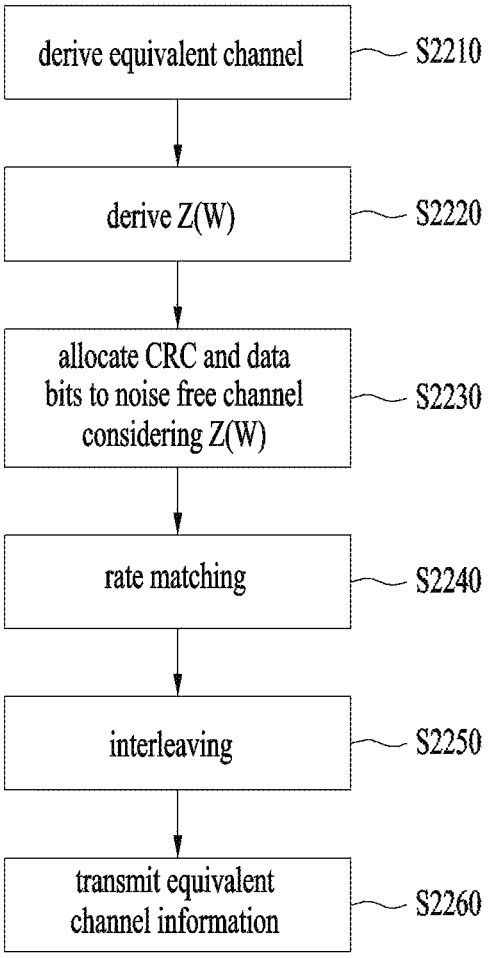
FIG. 22 is a diagram illustrating an example of a procedure of transmitting data from a transmitter through polar coding.

FIG. 22 is a diagram illustrating an example of a procedure of transmitting data from a transmitter through polar coding.

The transmitter can derive equivalent channels by repeatedly performing a channel combining procedure and a channel splitting procedure. That is, if the channel combining procedure and the channel splitting procedure are performed, the equivalent channels are categorized into a noise channel and a noise free channel (S2210).

The transmitter derives the Bhattacharyya parameter Z(W) described in the clause 3.1 in accordance with each input bit to discover the noise free channel from the categorized equivalent channel (S2220).

The transmitter allocates a data payload comprised of CRC bits and data bits to the noise free channel. At this time, the transmitter may improve receiving performance of the receiver by allocating the CRC bits to the noise free channel better than the data bits (S2230).

Also, it is assumed that the size of the polar encoder to which the data payload is input to performed polar coding is N and the size of the data payload is K. In this case, the transmitter performs puncturing or truncation if N>k, and performs rate matching by performing repetition if N<k. Its detailed description will be understood with reference to the clause 3.2 (S2240).

The transmitter performs interleaving for polar coded code bits (or code symbols) and transmits the interleaved code bits to the receiver (S2250).

However, the receiver should know size information k indicating the size of the data payload input to the polar encoder and a coding rate k/N of the polar encoder to detect and decode the polar coded code bits. Therefore, the transmitter can transmit the size information on the size of the data payload and the coding rate information of the polar encoder to the receiver (S2260).

The step S2260 may be performed if the transmitter receives data from the higher layer, or may be performed after the data payload is input to the polar encoder.

4. Method for Performing HARQ Using Polar Code

If polar coding is used, it is preferable that IR (Incremental Redundancy)-HARQ scheme to obtain HARQ gain. The IR scheme is a retransmission scheme for obtaining maximum coding gain by setting a redundancy version (RV) during retransmission differently from that during initial transmission.

For example, it is assumed that the data payload size N is not changed during retransmission. Then, it is preferable to set maximum polar coding gain by setting puncturing and repetition patterns of the polar encoder during retransmission. Hereinafter, a method for performing HARQ when polar coding is used will be described.

4.1 Configuration of Generator Matrix Based on Puncturing

Hereinafter, a case where transmission of the data payload is performed through puncturing during retransmission including initial transmission will be described.

Puncturing is performed as much as the number of bits of the generator matrix, which will be punctured in the order of the smaller column weight value. If bit streams corresponding to all the columns are punctured, the same puncturing pattern is performed again. A priority may be given to columns having the same weight value.

For example, the priority may be set in the order of column index of the generator matrix. The generator matrix of the Equation 11 is assumed as a mother generator matrix. At this time, puncturing is performed in the order of the eighth column, the fourth column, the sixth column, the seventh column, the second column, the third column, the fifth column, and the first column considering column index in case of the order of the smaller column weight value and the same column weight value.

That is, if 2 bits are punctured to transmit codewords of 6 bits during the first transmission, the transmitter transmits columns corresponding to the eighth bit and the fourth bit in the Equation 11 by puncturing the columns. Also, if codewords of 5 bits are transmitted during the second transmission, the transmitter can transmit the column corresponding to 3 bits in the Equation 11 by puncturing the corresponding column. For example, the transmitter can configure the generator matrix by puncturing the columns corresponding to the sixth bit, the seventh bit and the second bit. Also, if the third retransmission is required and codewords of 4 bits are retransmitted, the transmitter can configure the generator matrix by puncturing the column corresponding to 4 bits. For example, the transmitter can puncture the columns corresponding to the third bit, the fifth bit, the first bit and the eighth bit.

If the transmitter performs permutation for the columns of the generator matrix in the order of column weight value, the transmitter can perform puncturing in the reverse order of column index.

4.2 Configuration of Generator Matrix Based on Repetition

Hereinafter, a case where transmission of the corresponding data payload is performed by repetition during retransmission including initial transmission will be described.

If the generator matrix is configured through repetition, repetition can be performed as much as the number of repetition bits in the order of the greater column weight value of the mother generator matrix. If repetition is performed for bit streams corresponding to all the columns, the same repetition pattern can be performed again. Also, a priority may be set to the columns having the same weight value. In this case, the priority may be set in the order of column index of the generator matrix.

The generator matrix of the Equation 11 is assumed as a mother generator matrix. At this time, repetition can be performed in the order of the first column, the second column, the third column, the fifth column, the fourth column, the sixth column, the seventh column and the eighth column considering column index in case of the order of the greater column weight value and the same column weight value.

At this time, if the transmitter transmits codewords of 10 bits during the first transmission, a new generator matrix is configured by repetition of the column corresponding to 2 bits. If 3 bits are repeatedly transmitted during the second transmission, the third bit, the fifth bit and the fourth bit are repeatedly transmitted. If 4 bits are repeatedly retransmitted during the third transmission, repetition is performed for the columns corresponding to the sixth bit, the seventh bit, the eighth bit and the first bit to configure the generator matrix, whereby the data payload is transmitted.

If the transmitter performs permutation for the columns of the generator matrix in the order of column weight value, the transmitter can perform repetition in the order of column index.

4.3 Configuration of Generator Matrix Based on Puncturing and Repetition

Hereinafter, a case where a generator matrix is configured through puncturing and repetition during initial transmission and retransmission will be described.

The transmitter can transmit the data payload by independently using the clauses 4.1 and 4.2 in accordance with puncturing and repetition patterns of previous transmission. For example, if current transmission is performed using the repetition pattern, the scheme described in the clause 4.2 is used considering the repetition pattern of the previous transmission.

Also, if current transmission is performed using puncturing, the scheme described in the clause 4.1 can be used considering the puncturing pattern of transmission corresponding to puncturing of the previous transmission.

If the transmitter performs permutation for the columns of the generator matrix in the order of column weight value, the transmitter can perform puncturing in the reverse order of column index.

5. Apparatuses

Figure 23:
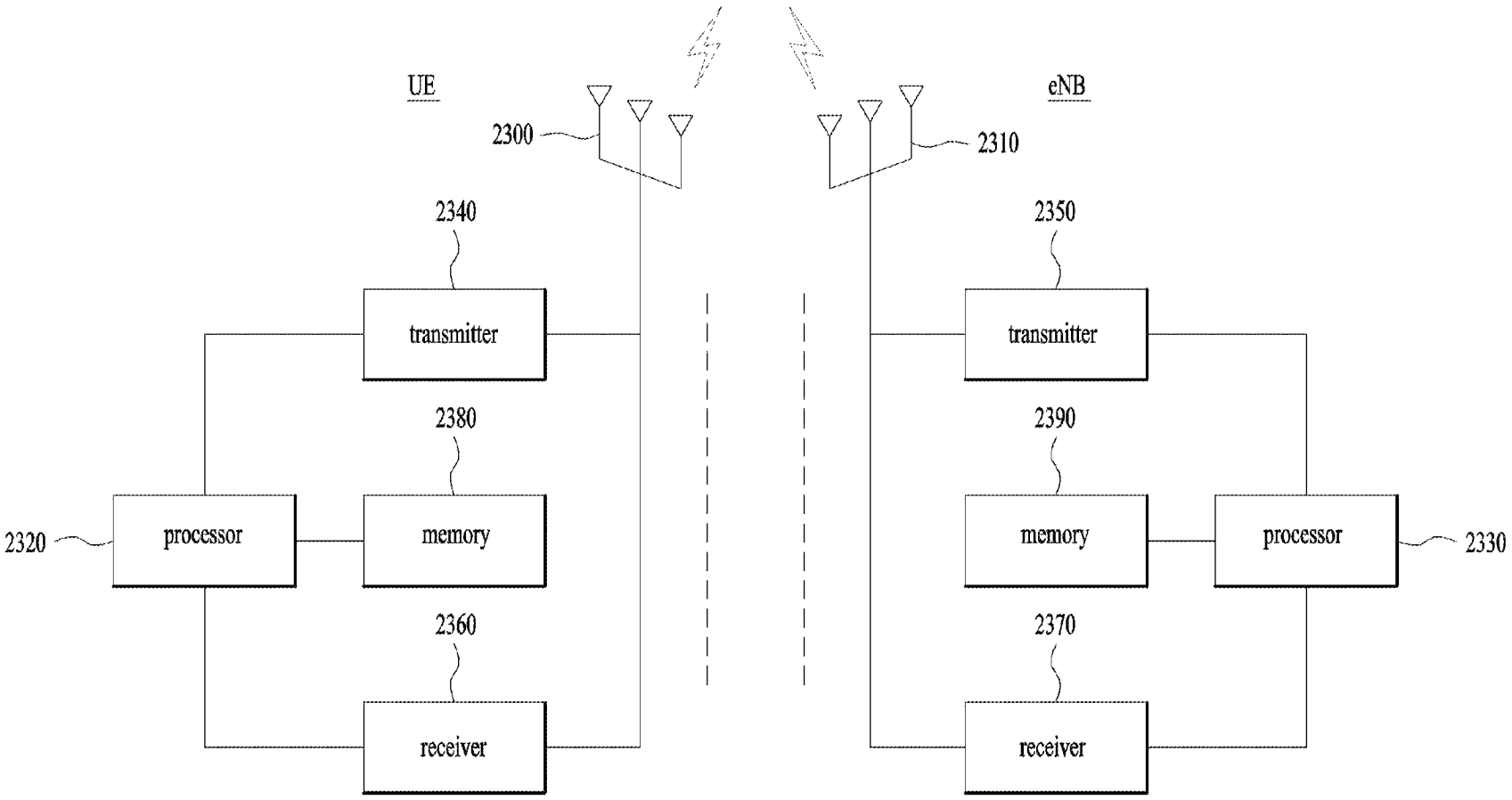
FIG. 23 is a diagram illustrating a device through which methods described in FIG. 1 to FIG. 22 can be embodied.

Apparatuses illustrated in FIG. 23 are means that can implement the methods described before with reference to FIGS. 1 to 22.

A UE may act as a transmitting end on a UL and as a receiving end on a DL. An eNB may act as a receiving end on a UL and as a transmitting end on a DL.

That is, each of the UE and the eNB may include a transmitter (Tx) 2340 or 2350 and a Receiver (Rx) 2360 or 2370, for controlling transmission and reception of information, data, and/or messages, and an antenna 2300 or 2310 for transmitting and receiving information, data, and/or messages.

Each of the UE and the eNB may further include a processor 2320 or 2330 for implementing the afore-described embodiments of the present disclosure and a memory 2380 or 2390 for temporarily or permanently storing operations of the processor 2320 or 2330.

The embodiments of the present invention can be performed using the elements and functions of the aforementioned UE and the aforementioned eNB. For example, the processor of the UE and the eNB can transmit encoded data by performing polar coding by means of combination of the methods described in the aforementioned clauses 1 to 3. Its details will be understood with reference to the clauses 1 to 3.

The Tx and Rx of the UE and the eNB may perform a packet modulation/demodulation function for data transmission, a high-speed packet channel coding function, OFDMA packet scheduling, TDD packet scheduling, and/or channelization. Each of the UE and the eNB of FIG. 23 may further include a low-power Radio Frequency (RF)/Intermediate Frequency (IF) module.

Meanwhile, the UE may be any of a Personal Digital Assistant (PDA), a cellular phone, a Personal Communication Service (PCS) phone, a Global System for Mobile (GSM) phone, a Wideband Code Division Multiple Access (WCDMA) phone, a Mobile Broadband System (MBS) phone, a hand-held PC, a laptop PC, a smart phone, a Multi Mode-Multi Band (MM-MB) terminal, etc.

The smart phone is a terminal taking the advantages of both a mobile phone and a PDA. It incorporates the functions of a PDA, that is, scheduling and data communications such as fax transmission and reception and Internet connection into a mobile phone. The MB-MM terminal refers to a terminal which has a multi-modem chip built therein and which can operate in any of a mobile Internet system and other mobile communication systems (e.g. CDMA 2000, WCDMA, etc.).

Embodiments of the present disclosure may be achieved by various means, for example, hardware, firmware, software, or a combination thereof.

In a hardware configuration, the methods according to exemplary embodiments of the present disclosure may be achieved by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, microprocessors, etc.

In a firmware or software configuration, the methods according to the embodiments of the present disclosure may be implemented in the form of a module, a procedure, a function, etc. performing the above-described functions or operations. A software code may be stored in the memory 2380 or 2390 and executed by the processor 2320 or 2330. The memory is located at the interior or exterior of the processor and may transmit and receive data to and from the processor via various known means.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. It is obvious to those skilled in the art that claims that are not explicitly cited in each other in the appended claims may be presented in combination as an embodiment of the present disclosure or included as a new claim by a subsequent amendment after the application is filed.

INDUSTRIAL APPLICABILITY

The present disclosure is applicable to various wireless access systems including a 3GPP system, a 3GPP2 system, and/or an IEEE 802.xx system. Besides these wireless access systems, the embodiments of the present disclosure are applicable to all technical fields in which the wireless access systems find their applications.

The invention claimed is:

1. A method for transmitting data by using polar coding in a wireless access system, the method comprising:

[inputting first data bits to a polar encoder;

deriving Bhattacharyya parameters in accordance with the first data bits to discover noise free channels from equivalent channels, wherein the equivalent channels are defined for each of the first data bits;]

allocating a data payload including [second] data bits and cyclic redundancy check (CRC) bits to [the discovered] noise free channels *among equivalent channels of a polar encoder*, wherein the number of the [discovered] noise free channels corresponds to a total number of bits of the data payload; *and*

[performing rate matching for the data payload based on a size of the polar encoder and a size of the data payload; and]

transmitting code bits output from the polar encoder[through the noise free channels], wherein the CRC bits are allocated to noise free channels [starting from a noise free channel] having [a] lowest error probability among the [discovered] noise free channels and the [second] data bits are allocated to the other noise free channels among the [discovered] noise free channels[according to the Bhattacharyya parameters].

2. The method according to claim 1, further comprising:

transmitting [size] information indicating [the] *a* size of the data payload and information [on] *regarding* a coding rate of the polar encoder to a receiver.

3. The method according to claim 1[, wherein the] *further comprising:*

*performing* rate matching [is performed] *for the data payload* by puncturing or repeating the data payload [in accordance with] *based on* the size of the polar encoder.

4. The method according to claim 3, further comprising:

generating a generator matrix for the polar encoder by puncturing one or more specific columns of a mother generator matrix based on [the] *a* size of the data payload when the size of [the code block of] the polar encoder is greater than the size of the data payload when performing *the* rate matching.

5. The method according to claim 4, wherein the one or more specific columns are selected starting from a column having a lowest weight value.

6. The method according to claim 4, wherein the one or more specific columns are selected considering a minimum distance set based on an index of a noise free channel to which the data bits are allocated.

7. The method according to claim 4, wherein the one or more specific columns are selected based on a priority according to a column index.

8. The method according to claim 3, further comprising:

generating a generator matrix for the polar encoder by repeating one or more specific columns of a mother generator matrix based on [the] *a* size of the data payload when the size of [the code block of] the polar encoder is smaller than the size of the data payload when performing *the* rate matching.

9. The method according to claim 8, wherein the one or more specific columns are selected starting from a column having a highest weight value.

*10. A method for transmitting data by using polar coding at a transmitting device in a wireless communication system, the method comprising:*

*allocating a payload of K bits to K predetermined input bits among N input bits for a polar code of size N, where K is a positive integer not greater than N;*

*generating encoded bits based on the N input bits and the polar code; and*

*transmitting the encoded bits to a receiving device,*

*wherein the payload includes L data bits and M cyclic redundancy check (CRC) bits, where L+M=K, and L and M are positive integers, and*

*wherein the M CRC bits are allocated to M most reliable input bits among the K predetermined input bits.*

*11. The method according to claim 10, further comprising:*

*allocating 0 to each of N-K input bits other than the K predetermined input bits among the N input bits for the polar code,*

*wherein the K predetermined input bits have higher reliability than the N-K input bits.*

*12. The method according to claim 10, further comprising:*

*transmitting information regarding K and information regarding a code rate for the payload.*

*13. A transmitting device for transmitting data by using polar coding in a wireless communication system, the transmitting device comprising:*

*a transmitter;*

*at least one processor; and*

*at least one computer memory that is operably connectable to the at least one processor and that has stored thereon instructions which, when executed, cause the at least one processor to perform operations comprising:*

*allocating a payload of K bits to K predetermined input bits among N input bits for a polar code of size N, where K is a positive integer not greater than N;*

*generating encoded bits based on the N input bits and the polar code; and*

*transmitting, via the transmitter, the encoded bits to a receiving device,*

*wherein the payload includes L data bits and M cyclic redundancy check (CRC) bits, where L+M=K, and L and M are positive integers, and*

*wherein the M CRC bits are allocated to M most reliable input bits among the K predetermined input bits.*

*14. The transmitting device according to claim 13, wherein the operations further comprising:*

*allocating 0 to each of N-K input bits other than the K predetermined input bits among the N input bits for the polar code,*

*wherein the K predetermined input bits have higher reliability than the N-K input bits.*

*15. The transmitting device according to claim 13, further comprising:*

*transmitting, via the transmitter, information regarding K and information regarding a code rate for the payload.*

*16. A receiving device for receiving data by using polar coding in a wireless communication system, the receiving device comprising:*

*a receiver;*

*at least one processor; and*

*at least one computer memory that is operably connectable to the at least one processor and that has stored thereon instructions which, when executed, cause the at least one processor to perform operations comprising:*

*receiving, via the receiver, encoded bits from a transmitting device; and*

*decoding the encoded bits to obtain a payload of K bits based on a polar code of size N,*

*wherein the encoded bits are decoded based on a mapping relationship between the payload of K bits and K predetermined input bits among N input bits for the polar code, where K is a positive integer not greater than N;*

*wherein the payload includes L data bits and M cyclic redundancy check (CRC) bits, where L+M=K, and L and M are positive integers, and*

*wherein the mapping relationship comprises: mapping the M CRC bits to M most reliable input bits among the K predetermined input bits.*

*17. The receiving device according to claim 16, wherein the mapping relationship further comprises:*

*mapping 0 to each of N-K input bits other than the K predetermined input bits among the N input bits for the polar code,*

*wherein the K predetermined input bits have higher reliability than the N-K input bits.*

*18. The receiving device according to claim 16, wherein the operations further comprise:*

*receiving, via the receiver, information regarding K and information regarding a code rate for the payload.*

* * * * *